United States Patent
Ohnuma et al.

(10) Patent No.: US 7,829,432 B2
(45) Date of Patent: Nov. 9, 2010

(54) METHOD FOR MANUFACTURING SOI SUBSTRATE

(75) Inventors: Hideto Ohnuma, Atsugi (JP); Kenichiro Makino, Atsugi (JP); Yoichi Iikubo, Machida (JP); Masaharu Nagai, Atsugi (JP); Aiko Shiga, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/489,594

(22) Filed: Jun. 23, 2009

(65) Prior Publication Data

US 2009/0325363 A1    Dec. 31, 2009

(30) Foreign Application Priority Data

Jun. 25, 2008   (JP) .............................. 2008-166447

(51) Int. Cl.
*H01L 21/30* (2006.01)
*H01L 21/46* (2006.01)
(52) U.S. Cl. ............................... 438/457; 257/E21.568
(58) Field of Classification Search ................ 438/457, 438/FOR. 222, FOR. 485; 257/E21.568
See application file for complete search history.

(56) References Cited

U.S. PATENT DOCUMENTS

| | | | |
|---|---|---|---|
| 6,372,609 B1 | 4/2002 | Aga et al. |
| 6,534,380 B1 | 3/2003 | Yamauchi et al. |
| 6,583,440 B2 | 6/2003 | Yasukawa |
| 6,661,065 B2 | 12/2003 | Kunikiyo |
| 6,818,921 B2 | 11/2004 | Yasukawa |
| 7,112,514 B2 | 9/2006 | Yasukawa |
| 7,119,365 B2 | 10/2006 | Takafuji et al. |
| 7,148,124 B1 | 12/2006 | Usenko |
| 7,446,019 B2 | 11/2008 | Daval et al. |
| 7,449,395 B2 | 11/2008 | Allibert et al. |

(Continued)

FOREIGN PATENT DOCUMENTS

EP    1 045 448    10/2000

(Continued)

OTHER PUBLICATIONS

International Search Report (Application No. PCT/JP2009/061149) dated Sep. 29, 2009.

(Continued)

*Primary Examiner*—W. David Coleman
(74) *Attorney, Agent, or Firm*—Eric J. Robinson; Robinson Intellectual Property Law Office, P.C.

(57) ABSTRACT

To improve bonding strength and improve reliability of an SOI substrate in bonding a semiconductor substrate and a base substrate to each other even when an insulating film containing nitrogen is used as a bonding layer, an oxide film is provided on the semiconductor substrate side, a nitrogen-containing layer is provided on the base substrate side, and the oxide film formed on the semiconductor substrate and the nitrogen-containing layer formed over the base substrate are bonded to each other. Further, plasma treatment is performed on at least one of the oxide film and the nitrogen-containing layer before bonding the oxide film formed on the semiconductor substrate and the nitrogen-containing layer formed over the base substrate to each other. Plasma treatment can be performed in a state in which a bias voltage is applied.

11 Claims, 17 Drawing Sheets

U.S. PATENT DOCUMENTS

| | | |
|---|---|---|
| 7,619,250 B2 | 11/2009 | Takafuji et al. |
| 2002/0047169 A1 | 4/2002 | Kunikiyo |
| 2003/0183876 A1 | 10/2003 | Takafuji et al. |
| 2003/0201508 A1 | 10/2003 | Yasukawa |
| 2003/0207545 A1 | 11/2003 | Yasukawa |
| 2004/0038505 A1 | 2/2004 | Ito et al. |
| 2005/0042798 A1 | 2/2005 | Nagao et al. |
| 2006/0068563 A1 | 3/2006 | Wong et al. |
| 2007/0020947 A1 | 1/2007 | Daval et al. |
| 2007/0026638 A1 | 2/2007 | Henley |
| 2007/0063281 A1 | 3/2007 | Takafuji et al. |
| 2007/0173033 A1 | 7/2007 | Allibert et al. |
| 2007/0281440 A1 | 12/2007 | Cites et al. |
| 2008/0038908 A1 | 2/2008 | Henley |
| 2008/0305317 A1 | 12/2008 | Ito et al. |
| 2008/0318394 A1 | 12/2008 | Kakehata et al. |
| 2009/0004822 A1 | 1/2009 | Murakami et al. |
| 2009/0023267 A1 | 1/2009 | Daval et al. |
| 2009/0075456 A1 | 3/2009 | Akimoto et al. |
| 2009/0079024 A1 | 3/2009 | Yamazaki |
| 2009/0098704 A1 | 4/2009 | Ohnuma et al. |
| 2009/0098739 A1 | 4/2009 | Ohnuma et al. |
| 2009/0111236 A1 | 4/2009 | Kakehata et al. |

FOREIGN PATENT DOCUMENTS

| | | |
|---|---|---|
| EP | 1 981 064 | 10/2008 |
| JP | 2000-124092 | 4/2000 |
| JP | 2002-076336 | 3/2002 |
| JP | 2002-170942 | 6/2002 |
| WO | WO 2008/014339 | 1/2008 |

OTHER PUBLICATIONS

Written Opinion (Application No. PCT/JP2009/061149) dated Sep. 29, 2009.

METHOD FOR MANUFACTURING SOI SUBSTRATE

TECHNICAL FIELD

The present invention relates to a method for manufacturing a substrate over which a semiconductor layer is provided with an insulating film interposed therebetween. In particular, the present invention relates to a method for manufacturing an SOI (silicon on insulator) substrate. In addition, the present invention relates to a method for manufacturing a semiconductor device using a substrate over which a semiconductor layer is provided with an insulating film interposed therebetween.

BACKGROUND ART

In recent years, an integrated circuit using an SOI (silicon on insulator) substrate in which a thin single crystal semiconductor layer is formed on an insulating surface, instead of a bulk silicon wafer has been developed. Since parasitic capacitance between a drain of a transistor and a substrate is reduced by using the SOI substrate, the SOI substrate has attracted attention as one improving performance of semiconductor integrated circuits.

One of known methods for manufacturing SOI substrates is a hydrogen ion implantation separation method (for example, see Patent Document 1). A method for manufacturing an SOI substrate using a hydrogen ion implantation separation method is briefly described below. First, hydrogen ions are implanted into a silicon wafer by an ion implantation method to form a microbubble layer at a predetermined depth from the surface. Then, the silicon wafer into which the hydrogen ions are implanted is bonded to another silicon wafer with a silicon oxide film interposed therebetween. Then, by heat treatment, the microbubble layer serves as a cleavage plane and a part of the silicon wafer into which hydrogen ions have been implanted is separated in a thin film shape along the microbubble layer. Accordingly, a single crystal silicon film can be formed over the other bonded silicon wafer.

A method for forming a single crystal silicon layer over a base substrate made from glass by using such a hydrogen ion implantation method as described above has been proposed (for example, see Patent Document 2). Since a glass substrate has a larger area and is less expensive than a silicon wafer, when a glass substrate is used as a base substrate, an inexpensive large-area SOI substrate can be manufactured.

Further, in Patent Document 2, it is disclosed that a silicon nitride film is provided between a base substrate and a single crystal silicon layer so as to prevent impurities included in the base substrate or the like from diffusing into the single crystal silicon layer.

[Citation List]

[Patent Document]
[Patent Document 1] Japanese Published Patent Application No. 2000-124092.
[Patent Document 2] Japanese Published Patent Application No. 2002-170942.

DISCLOSURE OF INVENTION

In the case where a silicon nitride film is formed on a single crystal silicon substrate side, if the single crystal silicon substrate and the silicon nitride film are provided in contact with each other, characteristics of a transistor may be adversely affected by an interface state. Therefore, in the case where the silicon nitride film is formed on the single crystal silicon substrate side, an insulating film such as a silicon oxide film needs to be provided between the single crystal silicon substrate and the silicon nitride film, and a problem arises in that the number of manufacturing steps is increased. In manufacturing an SOI substrate, a cost reduction by simplification of a manufacturing process or the like is important because a single crystal silicon substrate used is expensive. In addition, in the case where a plurality of insulating films are stacked to be formed, defective bonding between a base substrate and a single crystal semiconductor substrate may occur due to dust or an impurity which is generated in accordance with an increase in the number of steps.

Further, in the case where the silicon nitride film is used as a bonding layer, the obtained film is more likely to have an uneven surface or the like than the silicon oxide film. In addition, bonding strength between the base substrate and the single crystal semiconductor substrate may be insufficient because hydrogen bonding hardly occurs in a bonding surface, and reliability of the SOI substrate may be reduced.

An object of an embodiment of the present invention is to improve bonding strength and improve reliability of an SOI substrate even in the case where an insulating film containing nitrogen is used as a bonding layer in bonding a semiconductor substrate and a base substrate to each other.

An embodiment of the present invention is to provide an oxide film on a semiconductor substrate side and a nitrogen-containing layer on a base substrate side and bond the oxide film formed on the semiconductor substrate and the nitrogen-containing layer formed over the base substrate to each other.

Further, it is preferable that plasma treatment be performed on at least one of the oxide film and the nitrogen-containing layer before the oxide film formed on the semiconductor substrate and the nitrogen-containing layer formed over the base substrate are bonded to each other. Plasma treatment can be performed in a state in which a bias voltage is applied.

An embodiment of the present invention includes the steps of: forming an oxide film on a semiconductor substrate and irradiating the semiconductor substrate with accelerated ions through the oxide film to form an embrittled region at a predetermined depth from a surface of the semiconductor substrate; forming a nitrogen-containing layer over a base substrate; performing plasma treatment on at least one of the oxide film on the semiconductor substrate and the nitrogen-containing layer over the base substrate; disposing the surface of the semiconductor substrate and a surface of the base substrate to face each other to bond a surface of the oxide film and a surface of the nitrogen-containing layer to each other; and performing heat treatment after bonding the surface of the oxide film and the surface of the nitrogen-containing layer to each other and causing separation along the embrittled region to form a semiconductor layer over the base substrate with the oxide film and the nitrogen-containing layer interposed therebetween.

An embodiment of the present invention includes the steps of: forming an oxide film on a semiconductor substrate and irradiating the semiconductor substrate with accelerated ions through the oxide film to form an embrittled region at a predetermined depth from a surface of the semiconductor substrate; performing first plasma treatment on a base substrate; forming a nitrogen-containing layer over the base substrate which is subjected to the first plasma treatment; performing second plasma treatment on at least one of the oxide film on the semiconductor substrate and the nitrogen-containing layer over the base substrate; disposing the surface of the semiconductor substrate and a surface of the base substrate to face each other to bond a surface of the oxide film and a surface of the nitrogen-containing layer; and performing heat treatment after bonding the surface of the oxide film and the surface of the nitrogen-containing layer to each other and causing separation along the embrittled region to form a semiconductor layer over the base substrate with the oxide film and the nitrogen-containing layer interposed therebetween.

An embodiment of the present invention includes the steps of: forming an oxide film on each of a plurality of semiconductor substrates and irradiating the plurality of semiconductor substrates with accelerated ions through the oxide films to form an embrittled region at a predetermined depth from each surface of the plurality of semiconductor substrates; forming a nitrogen-containing layer over a base substrate; performing plasma treatment on at least one of each of the oxide films on the plurality of semiconductor substrates and the nitrogen-containing layer over the base substrate; disposing each surface of the plurality of semiconductor substrates and a surface of the base substrate to face each other to bond each surface of the oxide films and a surface of the nitrogen-containing layer to each other; and performing heat treatment after bonding the surfaces of the oxide films and the surface of the nitrogen-containing layer and causing separation along the embrittled regions to form a plurality of semiconductor layers over the base substrate with the oxide films and the nitrogen-containing layer interposed therebetween.

An embodiment of the present invention includes the steps of: forming an oxide film on each of a plurality of semiconductor substrates; irradiating the plurality of semiconductor substrates with accelerated ions through the oxide films to form an embrittled region at a predetermined depth from each surface of the plurality of semiconductor substrates; performing first plasma treatment on a base substrate; forming a nitrogen-containing layer over the base substrate which is subjected to the first plasma treatment; performing second plasma treatment on at least one of the oxide films on the plurality of semiconductor substrates and the nitrogen-containing layer over the base substrate; disposing each surface of the plurality of semiconductor substrates and a surface of the base substrate to face each other to bond each surface of the oxide films and a surface of the nitrogen-containing layer to each other; and performing heat treatment after bonding the surfaces of the oxide films and the surface of the nitrogen-containing layer and causing separation along the embrittled regions to form a plurality of semiconductor layers over the base substrate with the oxide films and the nitrogen-containing layer interposed therebetween.

In this specification, silicon oxynitride contains more oxygen than nitrogen, and in the case where measurement is conducted using Rutherford backscattering spectrometry (RBS) and hydrogen forward scattering (HFS), silicon oxynitride preferably contains oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, silicon nitride oxide contains more nitrogen than oxygen, and in the case where measurement is conducted using RBS and HFS, silicon nitride oxide preferably contains oxygen, nitrogen, silicon, and hydrogen at concentrations ranging from 5 to 30 atomic %, 20 to 55 atomic %, 25 to 35 atomic %, and 10 to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

The term "single crystal" in this specification refers to a crystal in which crystal faces and crystal axes are uniform and constituent atoms of which are in a spatially ordered arrangement. However, although single crystals are structured by orderly aligned atoms, single crystals may include a lattice defect in which the alignment is disordered as a part or single crystals may include intended or unintended lattice strain.

Note that a semiconductor device in this specification generally indicates a device capable of functioning by utilizing semiconductor characteristics, and electro-optic devices, semiconductor circuits, and electronic devices are all semiconductor devices.

In addition, in this specification, a display device includes a light-emitting device and a liquid crystal display device. The light-emitting device includes a light-emitting element, and the liquid crystal display device includes a liquid crystal element. A light-emitting element includes, in its scope, an element whose luminance is controlled by a current or a voltage, and specifically includes an inorganic electroluminescent (EL) element, an organic EL element, and the like.

According to an embodiment of the present invention, by performing plasma treatment on at least one of an oxide film and a nitrogen-containing layer before bonding the oxide film formed on a semiconductor substrate and the nitrogen-containing layer formed over a base substrate to each other, bonding strength can be improved and reliability of an SOI substrate can be improved.

BRIEF DESCRIPTION OF DRAWINGS

FIGS. 2A-1 to 2A-4, 2B-1 to 2B-3, 2C, and 2D are diagrams illustrating an example of a method for manufacturing an SOI substrate.

BEST MODE FOR CARRYING OUT THE INVENTION

Figures 1, 1A:
FIGS. 1A-1 to 1A-4, 1B-1 and 1B-2, 1C, and 1D are diagrams illustrating an example of a method for manufacturing an SOI substrate.

Hereinafter, Embodiments and Examples of the present invention will be described with reference to the drawings. However, the present invention can be carried out in many different modes, and it is easily understood by those skilled in the art that the mode and detail can be variously changed without departing from the spirit and scope of the present invention. Therefore, the present invention is not interpreted as being limited to the following description of the embodiments and examples. Note that, in all the drawings for explaining the embodiments and examples, the same portions or portions having the same functions are denoted by the same reference numerals, and the description thereof will be made only once.

Embodiment 1

In this embodiment, a method for manufacturing a substrate over which a semiconductor layer is provided with an insulating film interposed therebetween (for example, an SOI substrate) is described with reference to the drawings.

First, a semiconductor substrate 100 is prepared (see FIG. 1A-1).

As the semiconductor substrate 100, a single crystal semiconductor substrate or a polycrystalline semiconductor substrate can be used, and examples thereof include single crystal and polycrystalline silicon substrates, single crystal and polycrystalline germanium substrates, compound semiconductor substrates of gallium arsenide, indium phosphide, and the like. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape is not limited to a circular shape, and a silicon substrate processed into a rectangular shape or the like can also be used as the semiconductor substrate 100. A case where a single crystal silicon substrate is used as the semiconductor substrate 100 is hereinafter described.

Note that it is preferable that a surface of the semiconductor substrate 100 be cleaned as appropriate in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like in terms of removing contamination. Further, diluted hydrogen fluoride and ozone water may be discharged alternately to clean the semiconductor substrate 100.

Figures 1, 1A, 2:
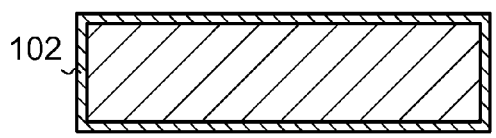
Figures 1, 1A, 2, 3:
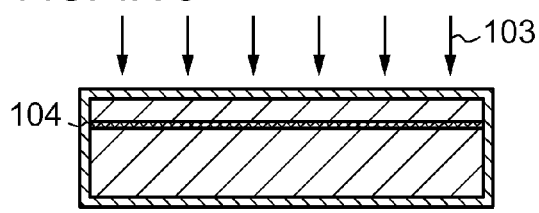
Figures 1, 1A, 2, 3, 4:
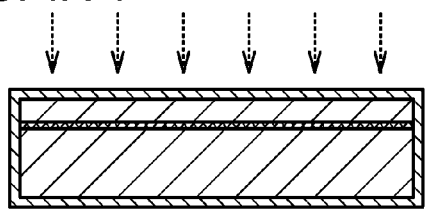

Next, an oxide film 102 is formed on the surface of the semiconductor substrate 100 (see FIG. 1A-2).

As the oxide film 102, for example, a single-layer film of a silicon oxide film, a silicon oxynitride film, or the like, or a stacked-layer film thereof can be used. These films can be formed by a thermal oxidation method, a CVD method, a sputtering method, or the like. In addition, when the oxide film 102 is formed by a CVD method, a silicon oxide film formed by using organosilane such as tetraethoxysilane (abbreviation: TEOS, chemical formula: $Si(OC_2H_5)_4$) is preferably used as the oxide film 102 in terms of productivity.

In this embodiment, a case where the oxide film 102 (here, a SiOx film) is formed by performing thermal oxidation treatment on the semiconductor substrate 100 is described (see FIG. 1A-2). The thermal oxidation treatment is preferably performed in an oxidizing atmosphere to which a halogen is added.

For example, the semiconductor substrate 100 is subjected to thermal oxidation treatment in an oxidizing atmosphere into which a chlorine (Cl) gas is introduced, whereby the oxide film 102 is formed through chlorine oxidation. In this case, the oxide film 102 contains chlorine atoms.

The chlorine atoms contained in the oxide film 102 forms distortions. As a result, absorption of moisture into the oxide film 102 is improved and diffusion rate is increased. That is, when moisture is present on a surface of the oxide film 102, the moisture present on the surface of the oxide film 102 can be rapidly absorbed and diffused into the oxide film 102.

As an example of thermal oxidation treatment, thermal oxidation can be performed in an oxidizing atmosphere which contains hydrogen chloride (HCl) at a proportion of 0.5 volume % to 10 volume % (preferably, 2 volume %) with respect to oxygen at a temperature of 900° C. to 1150° C. (typically, 1000° C.) (HCl oxidation). Treatment time may be set to 0.1 to 6 hours, preferably 0.5 to 1 hour. The thickness of an oxide film to be formed is set to 10 nm to 1000 nm (preferably, 50 nm to 300 nm), for example, 100 nm.

As another example of thermal oxidation treatment, thermal oxidation can be performed in an oxidizing atmosphere which contains trans-1,2-dichloroethylene (DCE) at a proportion of 0.25 volume % to 5 volume % (preferably, 3 volume %) with respect to oxygen at a temperature of 700° C. to 1150° C. (typically, 950° C.). Treatment time may be set to 0.1 to 6 hours, preferably 0.5 to 1 hour. The thickness of an oxide film to be formed is set to 10 nm to 1000 nm (preferably, 50 nm to 300 nm), for example, 100 nm.

Since trans-1,2-dichloroethylene is thermally decomposed at low temperature, the thermal oxidation treatment can be performed at low temperature. In particular, when a semiconductor substrate is repeatedly reused, productivity can be improved and adverse effect due to thermal shock can be reduced by performing thermal oxidation treatment at low temperature. Note that, instead of trans-1,2-dichloroethylene, cis-1,2-dichloroethylene, 1,1-dichloroethylene, or a mixed gas of two or more kinds of these gases may be used.

In this embodiment, the concentration of chlorine atoms in the oxide film 102 is controlled to $1 \times 10^{17}$ atoms/cm$^3$ to $1 \times 10^{21}$ atoms/cm$^3$.

The inclusion of chlorine atoms in the oxide film 102 is effective in preventing contamination of the semiconductor substrate 100 by trapping heavy metal (for example, Fe, Cr, Ni, or Mo) that is an extrinsic impurity.

Further, the oxide film 102 containing a halogen such as chlorine can serve to getter impurities (e.g., movable ions of Na) which adversely affect the semiconductor substrate. That is, by heat treatment which is performed after the oxide film 102 is formed, impurities included in the semiconductor substrate are separated out to the oxide film 102 and captured by reacting with the halogen (e.g., chlorine). Accordingly, the impurities captured in the oxide film 102 can be fixed and prevented from contaminating the semiconductor substrate 100. That is, when bonded to a glass substrate, the oxide film 102 containing a halogen such as chlorine can function as a film for neutralizing impurities such as Na included in the glass substrate.

In particular, containing a halogen such as chlorine in the oxide film 102 by HCl oxidation or the like is effective in a case where the semiconductor substrate is not sufficiently cleaned or in removing contamination of the semiconductor substrate which is repeatedly reused.

Further, inclusion of hydrogen in the gas for the thermal oxidation treatment has an effect of compensating a defect at the interface between the semiconductor substrate 100 and the oxide film 102 to decrease the localized state density of the interface. Therefore, it is preferable that the oxide film 102 contain hydrogen atoms at higher than or equal to $1\times10^{18}$ atoms/cm$^3$.

Note that, although the case where the thermal oxidation treatment is performed in an oxidizing atmosphere in which hydrogen chloride or dichloroethylene is contained as a formation method of the oxide film 102 containing chlorine atoms is described in the above description, an embodiment of the present invention is not limited thereto. For example, by performing thermal oxidation treatment on the semiconductor substrate 100 in an oxidizing atmosphere, the oxide film 102 (e.g. SiOx) is formed on the surface of the semiconductor substrate 100, and then chlorine atoms may be contained in the oxide film 102 by adding chlorine ions accelerated by an electric field with the use of an ion doping apparatus or an ion implantation apparatus. Alternatively, after the surface is processed with a hydrogen chloride (HCl) solution (hydrochloric acid), thermal oxidation treatment may be performed in an oxidizing atmosphere.

Note that halogen atoms contained in the oxide film 102 are not limited to the chlorine atoms. The oxide film 102 may contain fluorine atoms. In order to perform fluorine oxidation on the surface of the semiconductor substrate 100, any of the following methods may be used: a method in which after immersion of the surface of the semiconductor substrate 100 in an HF solution, thermal oxidation treatment is performed in an oxidizing atmosphere; and a method in which thermal oxidation treatment is performed on the semiconductor substrate 100 in an oxidizing atmosphere to which $NF_3$ is added.

Next, the semiconductor substrate 100 is irradiated with ions having kinetic energy to form an embrittled region 104 having a damaged crystal structure at a predetermined depth in the semiconductor substrate 100 (see FIG. 1A-3). As illustrated in FIG. 1A-3, by irradiation of the semiconductor substrate 100 with accelerated ions 103 through the oxide film 102, the ions 103 are added to a region at a predetermined depth from the surface of the semiconductor substrate 100, whereby the embrittled region 104 can be formed. The ions 103 are obtained as follows: a source gas is excited to generate plasma of the source gas, and ions included in this plasma are extracted from the plasma by the action of an electric field and are then accelerated.

The depth of a region where the embrittled region 104 is formed can be adjusted by kinetic energy, mass, incident angle of the ions 103, or the like. Kinetic energy can be adjusted by acceleration voltage, dose, or the like. The embrittled region 104 is formed at a depth equal to or substantially equal to the average penetration depth of the ions 103. Thus, the thickness of a semiconductor layer separated from the semiconductor substrate 100 is determined by the depth to which the ions 103 are added. The depth at which the embrittled region 104 is formed is adjusted such that the thickness of this semiconductor layer is 10 nm to 500 nm, preferably, 50 nm to 200 nm.

The embrittled region 104 can be formed by ion doping treatment. Ion doping treatment can be performed using an ion doping apparatus. A typical ion doping apparatus is a non-mass-separation apparatus with which an object placed in a chamber is irradiated with all ion species generated by excitation of a process gas into plasma. The apparatus is called a non-mass-separation apparatus because an object is irradiated with all ions species in plasma without mass separation. In contrast, an ion implantation apparatus is a mass-separation apparatus. An ion implantation apparatus is an apparatus with which an object is irradiated with an ion species having a specific mass after mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ion species, an electrode for exciting a source gas to generate plasma, and the like. As the electrode for generating plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to the components described above and an as-needed mechanism may be provided.

In this embodiment, hydrogen is added to the semiconductor substrate 100 with an ion doping apparatus. A hydrogen-containing gas is supplied as a plasma source gas. For example, $H_2$ is supplied. A hydrogen gas is excited to generate plasma; ions included in plasma are accelerated without mass separation; and the semiconductor substrate 100 is irradiated with the accelerated ions.

In an ion doping apparatus, the percentage of $H_3^+$ to the total amount of ion species ($H^+$, $H_2^+$, and $H_3^+$) that are generated from a hydrogen gas is set to 50% or higher. Preferably, the percentage of $H_3^+$ is set to 80% or higher. Because an ion doping apparatus does not involve mass separation, the percentage of one kind ($H_3^+$) to plural kinds of ion species that are generated in plasma is preferably 50% or higher, more preferably, 80% or higher. By irradiation with ions having the same mass, ions can be added in a concentrated manner to the same depth in the semiconductor substrate 100.

In order to form the embrittled region 104 in a shallow region, the acceleration voltage for the ions 103 needs to be low. With an increase in the percentage of $H_3^+$ ions in plasma, atomic hydrogen (H) can be efficiently added to the semiconductor substrate 100. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the cycle time for ion irradiation treatment can be shortened and productivity and throughput can be improved.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. Further, in the case where an ion doping apparatus is used, heavy metals may also be introduced together with $H_3^+$; however, by irradiation with ions through the oxide film 102 containing chlorine atoms, the semiconductor substrate 100 can be prevented from being contaminated due to these heavy metals as described above.

The step of irradiating the semiconductor substrate 100 with the accelerated ions 103 can also be performed with an ion implantation apparatus. An ion implantation apparatus is a mass-separation apparatus with which an object placed in a chamber is irradiated with an ion species having a specific mass after mass separation of plural kinds of ion species generated by excitation of a source gas into plasma. Thus, in the case of using an ion implantation apparatus, $H^+$ ions and $H_2^+$ ions that are generated by excitation of a hydrogen gas or PH$_3$ are subjected to mass separation, and either H$^+$ ions or H$_2^+$ ions are accelerated, with which the semiconductor substrate 100 is irradiated.

Figures 1, 1B:
Figures 1, 1B, 2:
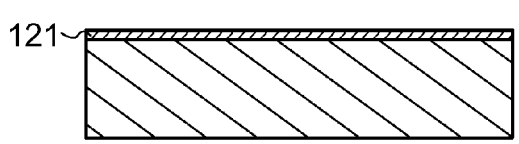

Next, a base substrate 120 is prepared (see FIG. 1B-1).

As the base substrate 120, a substrate made from an insulator is used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. In this embodiment, a case where a glass substrate is used is described. When a glass substrate that can be manufactured in large sizes and is inexpensive is used as the base substrate 120, cost reduction can be achieved as compared to when a silicon wafer is used.

Before the base substrate 120 is used, it is preferable that a surface of the base substrate 120 be cleaned in advance. Specifically, the base substrate 120 is subjected to ultrasonic cleaning using a hydrochloric acid/hydrogen peroxide mixture (HPM), a sulfuric acid/hydrogen peroxide mixture (SPM), an ammonium hydroxide/hydrogen peroxide mixture (APM), diluted hydrofluoric acid (DHF), or the like. For example, it is preferable that the surface of the base substrate 120 be subjected to ultrasonic cleaning using a hydrochloric acid/hydrogen peroxide mixture. By such cleaning treatment, the surface of the base substrate 120 can be planarized and residual abrasive particles can be removed.

Next, a nitrogen-containing layer 121 (for example, an insulating film containing nitrogen such as a silicon nitride film (SiN$_x$) or a silicon nitride oxide film (SiN$_x$O$_y$) (x>y)) is formed over the surface of the base substrate 120 (see FIG. 1B-2).

In this embodiment, the nitrogen-containing layer 121 serves as a layer (bonding layer) which is to be bonded to the oxide film 102 provided on the semiconductor substrate 100. In addition, when a semiconductor layer having a single crystal structure (hereinafter referred to as a "single crystal semiconductor layer") is provided over a base substrate later, the nitrogen-containing layer 121 also functions as a barrier layer for preventing impurities such as Na (sodium) contained in the base substrate from diffusing into the single crystal semiconductor layer.

Further, a surface of the nitrogen-containing layer 121 is preferably smooth for suppressing defective bonding between the semiconductor substrate 100 and the base substrate 120. Specifically, the nitrogen-containing layer 121 is formed to have a surface with an average surface roughness (Ra) of 0.5 nm or less and a root-mean-square surface roughness (Rms) of 0.60 nm or less, preferably, an average surface roughness of 0.35 nm or less and a root-mean-square surface roughness of 0.45 nm or less. The thickness is preferably in the range of 10 nm to 200 nm, more preferably, 50 nm to 100 nm.

In order to form the nitrogen-containing layer 121 as described above, it is preferable in this embodiment that a silicon nitride film or a silicon nitride oxide film be formed by a plasma CVD method at a substrate temperature during film formation higher than or equal to room temperature and lower than or equal to 350° C., more preferably, higher than or equal to room temperature and lower than or equal to 300° C. When the substrate temperature during film formation is low, the nitrogen-containing layer 121 can be formed to have less surface roughness. This is because as the substrate temperature during film formation becomes higher, etching reaction on a deposition surface of a film due to hydrogen radicals or the like becomes excessive and surface roughness is generated.

In addition, the nitrogen-containing layer 121 is preferably formed to contain hydrogen because hydrogen bonding greatly contributes to bonding between the oxide film 102 provided on the semiconductor substrate 100 and the nitrogen-containing layer 121. By use of a silicon nitride film or a silicon nitride oxide film containing hydrogen as the nitrogen-containing layer 121, it is possible to form strong bond with a base substrate such as a glass substrate by hydrogen bonding using Si—OH and N—OH bonds.

In this embodiment, in order to form the nitrogen-containing layer 121 as described above, film formation is preferably performed by a plasma CVD method using at least a silane gas, an ammonia gas, and a hydrogen gas. By use of an ammonia gas and a hydrogen gas, the nitrogen-containing layer 121 which contains hydrogen in itself can be obtained. Furthermore, when the substrate temperature during film formation is low, there are also advantages in that dehydrogenation reaction during film formation can be suppressed and the amount of hydrogen contained in the nitrogen-containing layer 121 can be increased.

The nitrogen-containing layer 121 which is obtained by a plasma CVD method at a low substrate temperature during film formation contains a large amount of hydrogen and has low density (or is soft). The nitrogen-containing layer 121 having low density can be densified (hardened) by heat treatment; thus, the thickness of the nitrogen-containing layer 121 can be decreased through the heat treatment.

Therefore, by bonding the nitrogen-containing layer 121 having low density and the semiconductor substrate 100 to each other, even when the surface of the oxide film 102 on the semiconductor substrate 100 or the surface of the nitrogen-containing layer 121 is uneven, the unevenness can be absorbed by shrink of the nitrogen-containing layer 121. Thus, defective bonding can be reduced. Moreover, by heat treatment performed at the same time as or after bonding, an element such as a transistor can be formed after the nitrogen-containing layer 121 is densified (hardened).

Next, at least one of the surface of the oxide film 102 formed on the semiconductor substrate 100 and the surface of the nitrogen-containing layer 121 formed over the base substrate 120 is preferably subjected to plasma treatment.

Plasma treatment of a surface of a substrate to be treated is performed by introducing an inert gas (such as an argon (Ar) gas) and/or a reactive gas (such as an oxygen (O$_2$) gas or a nitrogen (N$_2$) gas) into a chamber in a vacuum state and applying a high-frequency voltage between an electrode over which the substrate to be treated (the semiconductor substrate 100 or the base substrate 120) is placed and a counter electrode (creating a state in which a bias voltage is applied).

For example, oxygen plasma treatment of the substrate to be treated is performed by introducing an oxygen gas into a chamber in a vacuum state and applying a high-frequency voltage between an electrode over which the substrate to be treated is placed and the counter electrode (creating a state in which a bias voltage is applied). In this case, oxygen cations are present in plasma and accelerated in a cathode direction (to the substrate to be treated side). The accelerated oxygen cations are collided with the surface of the substrate to be treated, whereby impurities such as organic substances on the surface of the substrate to be treated is removed, which leads to activation of the surface of the substrate to be treated.

In the case where oxygen plasma treatment is performed on the oxide film 102 on the semiconductor substrate 100, the accelerated oxygen cations are collided with the surface of the oxide film 102, whereby Si—H, Si—H$_2$, and SiO$_2$ on the surface of the oxide film 102 can be decreased and (SiO$_2$)$_n$—OH can be increased. That is, by plasma treatment, hydrophilic groups on the surface of the oxide film 102 can be increased, and the number of hydrogen bonds on a bonding surface can be increased; therefore, bonding strength can be improved. In addition, by performing plasma treatment in a state in which a bias voltage is applied to the substrate to be treated, a micropore can be generated near the surface of the oxide film 102.

Further, in the case where plasma treatment is performed on the nitrogen-containing layer 121 over the base substrate 120, SiN and SiH$_3$ each having a hydrophobic property on the surface of the nitrogen-containing layer 121 can be decreased, and SiOx having a hydrophilic property can be increased; therefore, bonding strength can be improved even in the case where the nitrogen-containing layer 121 is used as a bonding layer.

Figure 11:
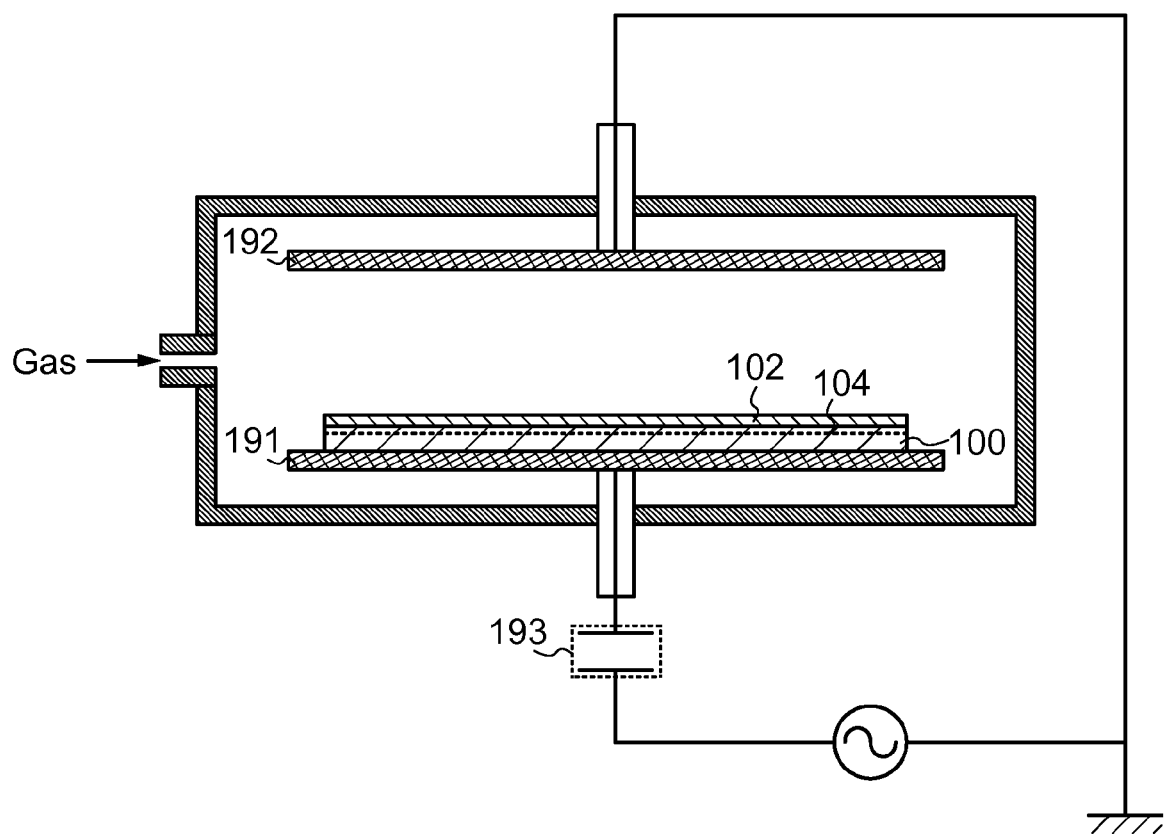
FIG. 11 is a diagram illustrating an example of plasma treatment in a method for manufacturing an SOI substrate.

In this embodiment, plasma treatment is performed using an oxygen gas by a method called a reactive ion etching (RIE) mode, which is a kind of capacitively coupled plasma (see FIG. 11).

The substrate to be treated (here, the semiconductor substrate 100 on which the oxide film 102 is formed) is placed on a stage over a first electrode 191 serving as a cathode to which a high-frequency voltage is applied through a condenser 193, and then a high-frequency voltage is applied to generate plasma between the first electrode 191 and a second electrode 192 serving as an anode. As a result, a negative self-bias is generated on the first electrode 191 side (a state in which a negative self-bias voltage is applied to the oxide film 102 is created), and cations in plasma are accelerated to collide with the surface of the oxide film 102. Note that, since the oxide film 102 on the semiconductor substrate 100 is formed with silicon oxide, etching action of the oxide film 102 can be reduced by using oxygen as a source gas.

Oxygen plasma treatment may be specifically performed under the following conditions: an electric power used for the treatment is 0.1 W/cm$^2$ to 1.5 W/cm$^2$; a pressure is 30 Pa to 130 Pa; and a gas (O$_2$) flow rate is 10 sccm to 200 sccm. By oxygen plasma treatment, the average roughness (R$_a$) of the surface of the oxide film 102 is preferably made 0.7 nm or less, more preferably, 0.3 nm or less.

Note that, in FIGS. 1A-1 to 1A-4, 1B-1 and 1B-2, 1C, and 1D, the case where plasma treatment is performed on the surface of the oxide film 102 on the semiconductor substrate 100 is described (see FIG. 1A-4); however, the nitrogen-containing layer 121 over the base substrate 120 may be subjected to plasma treatment instead of performing plasma treatment on the oxide film 102, or both the oxide film 102 and the nitrogen-containing layer 121 may be subjected to plasma treatment.

Figure 12:
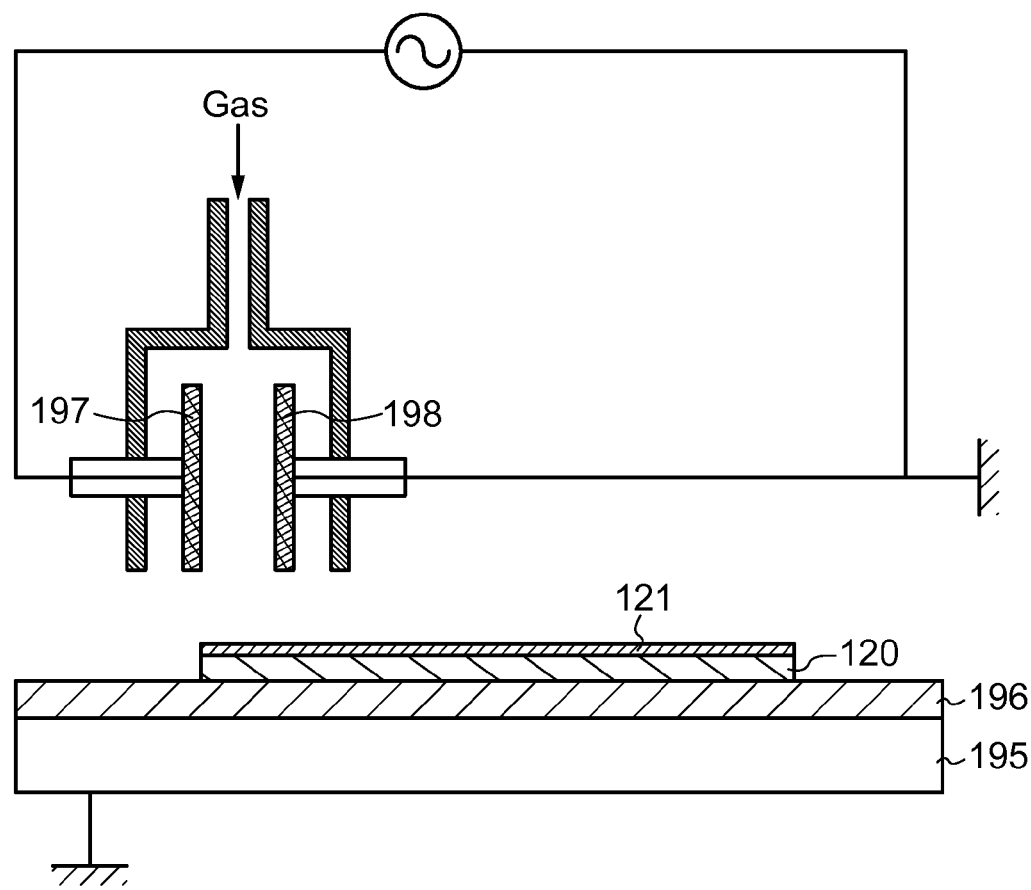
FIG. 12 is a diagram illustrating an example of plasma treatment in a method for manufacturing an SOI substrate.

Note that a method for performing plasma treatment which is applied to this embodiment is not limited to the case described with reference to FIG. 11. In addition, plasma treatment can be performed using atmospheric pressure plasma such as dielectric-barrier discharge (see FIG. 12).

For example, in the case where the surface of the nitrogen-containing layer 121 formed over the base substrate 120 is subjected to plasma treatment, after the base substrate 120 over which the nitrogen-containing layer 121 is formed is placed over a support 196 (for example, a glass substrate) provided over a stage 195 made of a conductor, a gas is introduced between a first electrode 197 and a second electrode 198 to generate atmospheric plasma. A potential difference is generated between the gas which is generated between the first electrode 197 and the second electrode 198 and which is made into plasma and the base substrate 120 which is provided over the support 196 (the gas which is made into plasma has a positive potential with respect to the nitrogen-containing layer 121), and cations in plasma are accelerated to collide with the surface of the nitrogen-containing layer 121 which is formed over the base substrate 120.

Atmospheric plasma may be specifically performed under the following conditions: an electric power used for the treatment is 100 W to 500 W; and a gas (O$_2$, N$_2$, O$_2$+N$_2$, Ar or He) flow rate is 10 sccm to 100 sccm. Note that in the case where an object (here, the nitrogen-containing layer 121) is larger than the distance between the first electrode 197 and the second electrode 198, the first electrode 197 and the second electrode 198 may be moved to be scanned.

Figure 1C:
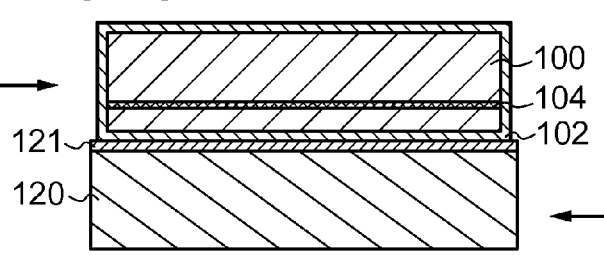

Next, the surface of the semiconductor substrate 100 and the surface of the base substrate 120 are disposed to face each other, and the surface of the oxide film 102 and the surface of the nitrogen-containing layer 121 are bonded to each other (see FIG. 1C).

Here, after the semiconductor substrate 100 and the base substrate 120 are disposed in contact with each other, a pressure of about 0.1 to 500 N/cm$^2$, preferably, 1 to 20 N/cm$^2$ is applied to a part of the semiconductor substrate 100. Bonding between the oxide film 102 and the nitrogen-containing layer 121 begins at the pressed portion and then the spontaneous bonding proceeds throughout the surface. This bonding step is performed by the action of van der Waals force or hydrogen bonding and can be performed at room temperature without any heat treatment. Thus, a substrate having a low allowable temperature limit, such as a glass substrate, can be used as the base substrate 120.

Note that, before the semiconductor substrate 100 and the base substrate 120 are bonded to each other, the oxide film 102 formed on the semiconductor substrate 100 and the nitrogen-containing layer 121 formed over the base substrate 120 are preferably subjected to surface treatment. As surface treatment, ozone treatment (such as cleaning with ozone water), megasonic cleaning, two fluid cleaning (a method for spraying functional water such as pure water or hydrogen-containing water with a carrier gas such as nitrogen), or a combination thereof can be performed. Further, cleaning with ozone water and cleaning with hydrofluoric acid may be repeated plural times. In particular, after plasma treatment is performed on the surface of the oxide film 102 and the surface of the nitrogen-containing layer 121 as described above, surface treatment is performed, whereby dust such as organic substances on the surface of the oxide film 102 and the surface of the nitrogen-containing layer 121 can be removed and the surfaces can be made hydrophilic. As a result, bonding strength between the oxide film 102 and the nitrogen-containing layer 121 can be improved.

Here, an example of ozone treatment is described. For example, ozone treatment can be performed on a surface of an object by irradiation with ultraviolet (UV) in an atmosphere containing oxygen. Ozone treatment in which irradiation with ultraviolet is performed under an atmosphere containing oxygen is also called UV ozone treatment, ultraviolet ozone treatment, or the like. In an atmosphere containing oxygen, irradiation with light including a wavelength of less than 200 nm and light including a wavelength of greater than or equal to 200 nm among ultraviolet is performed, whereby ozone can be generated and singlet oxygen can be generated by ozone. Irradiation with light including a wavelength of less than 180 nm among ultraviolet is performed, whereby ozone can be generated and singlet oxygen can be generated by ozone.

Examples of reactions which occur by performing irradiation with light including a wavelength of less than 200 nm and light including a wavelength of greater than or equal to 200 nm in an atmosphere containing oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with light (hν) including a wavelength ($\lambda_1$ nm) of less than 200 nm in an atmosphere containing oxygen ($O_2$) is performed to generate an oxygen atom ($O(^3P)$) in a ground state. Next, in the reaction formula (2), an oxygen atom ($O(^3P)$) in a ground state and oxygen ($O_2$) are reacted with each other to generate ozone ($O_3$). Then, in the reaction formula (3), irradiation with light including a wavelength ($\lambda_2$ nm) of greater than or equal to 200 nm in an atmosphere containing generated ozone ($O_3$) is performed to generate singlet oxygen $O(^1D)$ in an excited state. In an atmosphere containing oxygen, irradiation with light including a wavelength of less than 200 nm among ultraviolet is performed to generate ozone while irradiation with light including a wavelength of greater than or equal to 200 nm among ultraviolet is performed to generate singlet oxygen by decomposing ozone. The ozone treatment as described above, for example, can be performed by irradiation with light of a low-pressure mercury lamp ($\lambda_1$=185 nm, $\lambda_2$=254 nm) in an atmosphere containing oxygen.

In addition, examples of reactions which occur by performing irradiation with light including a wavelength of less than 180 nm in an atmosphere containing oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with light including a wavelength ($\lambda_3$ nm) of less than 180 nm in an atmosphere containing oxygen ($O_2$) is performed to generate singlet oxygen $O(^1D)$ in an excited state and an oxygen atom ($O(_3P)$) in a ground state. Next, in the reaction formula (5), an oxygen atom ($O(^3P)$) in a ground state and oxygen ($O_2$) are reacted with each other to generate ozone ($O_3$). In the reaction formula (6), irradiation with light including a wavelength ($\lambda_3$ nm) of less than 180 nm in an atmosphere containing generated ozone ($O_3$) is performed to generate singlet oxygen in an excited state and oxygen. In an atmosphere containing oxygen, irradiation with light including a wavelength of less than 180 nm among ultraviolet is performed to generate ozone and to generate singlet oxygen by decomposing ozone or oxygen. The ozone treatment as described above, for example, can be performed by irradiation with light of a Xe excimer UV lamp ($\lambda_3$=172 nm) in an atmosphere containing oxygen.

Chemical bonding of an organic substance attached to a surface of an object is cut by light including a wavelength of less than 200 nm, whereby the organic substance attached to the surface of the object or the organic substance whose chemical bonding is cut can be removed by oxidative decomposition with ozone or singlet oxygen generated by ozone. By performing ozone treatment as described above, a hydrophilic property and purity of the surface of the object can be increased, and bonding can be favorably performed.

In an atmosphere containing oxygen, ozone is generated by performing irradiation with ultraviolet. Ozone is effective in removal of the organic substance attached to the surface of the object. In addition, singlet oxygen is also effective in removal of the organic substance attached to the surface of the object as much as or more than ozone. Ozone and singlet oxygen are examples of oxygen in an active state, and collectively called active oxygen. As described with the above reaction formulae and the like, since there are reactions where ozone is generated in generating singlet oxygen or singlet oxygen is generated by ozone, here, such reactions including a reaction where singlet oxygen contributes are called ozone treatment for convenience.

Note that, after the semiconductor substrate 100 is bonded to the base substrate 120, heat treatment is preferably performed in order to increase the bonding strength between the oxide film 102 and the nitrogen-containing layer 121. This heat treatment is performed at a temperature where a crack is not generated in the embrittled region 104 and is performed at a temperature higher than or equal to room temperature and lower than 400° C., for example. The oxide film 102 and the nitrogen-containing layer 121 may be bonded to each other while heating is performed at a temperature within the above range. The heat treatment can be performed using a diffusion furnace, a heating furnace such as a resistance heating furnace, a rapid thermal annealing (RTA) apparatus, a microwave heating apparatus, or the like.

Generally, when heat treatment is performed at the same time as or after bonding the oxide film 102 and the nitrogen-containing layer 121 to each other, dehydration reaction at the bonding interface proceeds and bond is strengthened by strengthening of hydrogen bonding and formation of covalent bonding. In order to promote the dehydration reaction, moisture generated at the bonding interface through the dehydration reaction should be removed by heat treatment at high temperature. In other words, when heat treatment after bonding is performed at low temperature, moisture generated at the bonding interface through a dehydration reaction cannot be removed effectively; thus, the dehydration reaction does not progress and bonding strength cannot be improved sufficiently.

In the case where an oxide film containing chlorine atoms or the like is used as the oxide film 102, the oxide film 102 can absorb and diffuse moisture. Accordingly, even when heat treatment after bonding is performed at low temperature, moisture generated at the bonding interface through the dehydration reaction can be absorbed and diffused into the oxide film 102 and the dehydration reaction can be promoted efficiently. In this case, even when a low heat-resistant substrate such as a glass substrate is used as the base substrate 120, the bonding strength between the oxide film 102 and the nitrogen-containing layer 121 can be sufficiently improved. Further, when plasma treatment is performed by applying a bias voltage, moisture can be effectively absorbed and diffused into the oxide film 102 by a micropore formed in the vicinity of the surface of the oxide film 102. Accordingly, the bonding strength between the oxide film 102 and the nitrogen-containing layer 121 can be improved even when heat treatment is performed at low temperature.

Figure 1D:
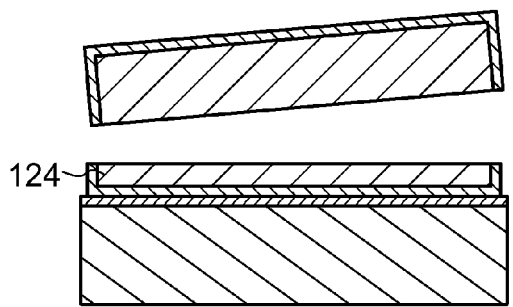

Next, heat treatment is performed to cause separation along the embrittled region 104, whereby a single crystal semiconductor layer 124 is provided over the base substrate 120 with the oxide film 102 and the nitrogen-containing layer 121 interposed therebetween (see FIG. 1D).

By heat treatment, volume change occurs in the microvoids formed in the embrittled region 104 due to temperature increase and a crack is generated in the embrittled region 104, whereby the semiconductor substrate 100 is separated along the embrittled region 104. Because the oxide film 102 is bonded to the base substrate 120, the single crystal semiconductor layer 124 which is separated from the semiconductor substrate 100 is formed over the base substrate 120. This heat treatment is performed at a temperature not exceeding the strain point of the base substrate 120.

This heat treatment can be performed using a diffusion furnace, a heating furnace such as a resistance heating furnace, an RTA apparatus, a microwave heating apparatus, or the like. For example, the heat treatment can be performed using an RTA apparatus at a heating temperature of 550° C. to 730° C. for 0.5 minute to 60 minutes.

Note that, by the heat treatment of FIG. 1D without the above-described heat treatment for increasing the bonding strength between the base substrate 120 and the oxide film 102, the heat treatment step for increasing the bonding strength between the oxide film 102 and the nitrogen-containing layer 121 and the heat treatment step for causing separation along the embrittled region 104 may be performed at the same time.

Through the above steps, an SOI substrate in which the single crystal semiconductor layer 124 is provided over the base substrate 120 with the oxide film 102 and the nitrogen-containing layer 121 interposed therebetween can be manufactured. By employment of the manufacturing method described in this embodiment, even in the case where the nitrogen-containing layer 121 is used as a bonding layer, bonding strength between the base substrate 120 and the single crystal semiconductor layer 124 can be improved. As a result, diffusion of impurities into the single crystal semiconductor layer 124 formed over the base substrate 120 can be suppressed and an SOI substrate in which the base substrate 120 and the single crystal semiconductor layer 124 are strongly bonded to each other can be formed.

In addition, by providing the nitrogen-containing layer on the base substrate side and forming the oxide film containing a halogen such as chlorine on the semiconductor substrate side, a manufacturing process can be simplified and impurity elements can be prevented from entering the semiconductor substrate before bonding the semiconductor substrate and the base substrate to each other. Further, by forming the oxide film containing a halogen such as chlorine as a bonding layer which is provided on the semiconductor substrate side, bonding strength can be improved by encouraging dehydrogenation reaction efficiently even when the heat treatment after bonding is performed at low temperature.

Note that, in this embodiment, planarization treatment may be performed on a surface of the obtained SOI substrate. By performing the planarization treatment, even when the single crystal semiconductor layer 124 provided over the base substrate 120 after separation has an uneven surface, the surface of the SOI substrate can be planarized.

The planarization treatment can be performed by chemical mechanical polishing (CMP), etching treatment, laser light irradiation, or the like. Here, the single crystal semiconductor layer 124 is recrystallized and its surface is planarized by being irradiated with laser light after etching treatment (etchback treatment) is performed by either dry etching or wet etching or by both in combination.

By irradiation with laser light from an upper surface side of the single crystal semiconductor layer, the upper surface of the single crystal semiconductor layer can be melted. After being melted, the single crystal semiconductor layer is cooled and solidified, whereby a single crystal semiconductor layer having an upper surface with higher planarity can be obtained. With use of laser light, the base substrate 120 is not directly heated; thus, increase in the temperature of the base substrate 120 can be suppressed. Accordingly, a substrate having low heat resistance, such as a glass substrate, can be used as the base substrate 120.

Note that it is preferable that the single crystal semiconductor layer 124 be partially melted by laser light irradiation. This is because, if the single crystal semiconductor layer 124 is completely melted, it is microcrystallized due to random nucleation after being changed into a liquid phase, so that crystallinity of the single crystal semiconductor layer 124 is highly likely to decrease. On the other hand, by partial melting, crystal growth proceeds from a non-melted solid phase part. Accordingly, defects in the semiconductor layer can be reduced. Note that "complete melting" herein means that the single crystal semiconductor layer is melted into a liquid state down to the vicinity of its lower interface. On the other hand, "partial melting" means that the upper portion of the single crystal semiconductor layer is melted into a liquid phase, but the lower portion is not melted and remains in a solid phase.

For the aforementioned laser light irradiation, a pulsed laser is preferably used. This is because a pulsed laser can instantaneously emit pulsed laser light with high energy, with which a partially melted state can easily be created. The repetition rate is preferably about 1 Hz to 10 MHz.

After the above-described laser light irradiation, a thinning step may be performed to reduce the thickness of the single crystal semiconductor layer 124. The single crystal semiconductor layer 124 may be thinned by etching treatment (etchback treatment) by either dry etching or wet etching or by both in combination. For example, when the single crystal semiconductor layer 124 is formed from a silicon material, the single crystal semiconductor layer 124 can be thinned by dry etching using $SF_6$ and $O_2$ as a process gas.

Note that not only an SOI substrate but also the semiconductor substrate 100 after separation may be subjected to planarization treatment. By planarization of the surface of the semiconductor substrate 100 after separation, the semiconductor substrate 100 can be reused in a manufacturing process of an SOI substrate.

Note that the method for manufacturing an SOI substrate described in this embodiment can be combined with manufacturing methods in another embodiment in this specification, as appropriate.

Embodiment 2

In this embodiment, a method for manufacturing an SOI substrate, which is different from that in the above-described embodiment, is described with reference to the drawings. Specifically, a case where a base substrate is subjected to plasma treatment before a nitrogen-containing layer is formed over the base substrate is described.

First, the semiconductor substrate 100 whose surface is provided with the oxide film 102 and in which the embrittled region 104 is provided at a predetermined depth is prepared (see FIGS. 2A-1 to 2A-3). Note that steps illustrated in FIGS. 2A-1 to 2A-3 can be performed in a similar manner to those illustrated in FIGS. 1A-1 to 1A-3.

Figures 1, 2A:
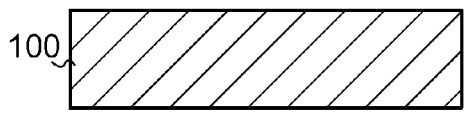
Figures 2, 2A:
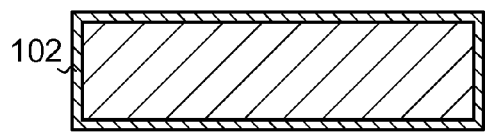
Figures 2, 2A, 3:
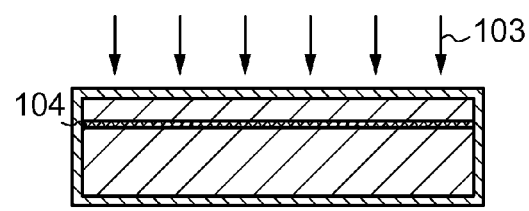
Figures 2, 2A, 3, 4:
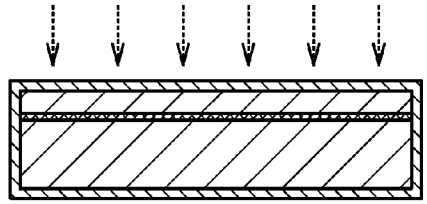
Figures 1, 2B:
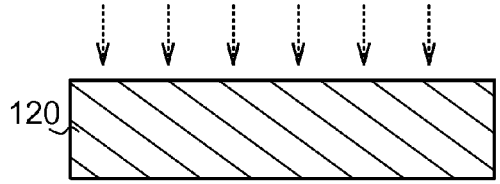
Figures 2, 2B:
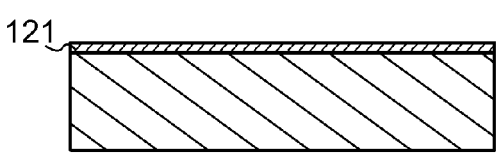
Figures 2, 2B, 3:
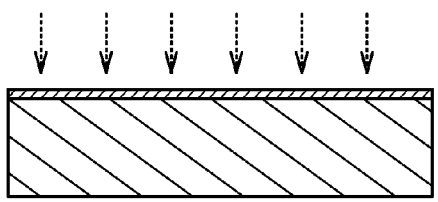

Next, after the base substrate 120 is prepared, planarization treatment by plasma treatment is performed on the base substrate 120 (see FIG. 2B-1).

Here, plasma treatment of the surface of the base substrate 120 is performed by introducing an inert gas (such as an Ar gas) and/or a reactive gas (such as an $O_2$ gas or a $N_2$ gas) into a chamber in a vacuum state and applying a high-frequency voltage between an electrode over which a substrate to be treated (here, the base substrate 120) is placed and a counter electrode (creating a state in which a bias voltage is applied).

In plasma, an electron and a cation of Ar are present, and the cation of Ar is accelerated in a cathode direction (the base substrate 120 side) when an Ar gas is introduced in a chamber. The cation of Ar, which is accelerated, collides with the surface of the base substrate 120, whereby the surface of the base substrate 120 is etched by sputtering. At this time, a projection of the surface of the base substrate 120 is preferentially etched by sputtering; thus, planarity of the surface of the base substrate 120 can be improved. In the case where a reactive gas is introduced, a defect caused when the surface of the base substrate 120 is etched by sputtering can be repaired.

By performing planarization treatment by plasma treatment, the surface of the base substrate 120 is set as follows: average surface roughness ($R_a$) is preferably 0.5 nm or less, more preferably 0.3 nm or less; and maximum height difference (P-V) is preferably 6 nm or less, more preferably 3 nm or less.

Specific conditions can be set as follows: an ICP power is 100 W to 3000 W (0.02 W/cm$^2$ to 0.7 W/cm$^2$); a pressure is 0.1 Pa to 5.0 Pa; a gas flow rate is 5 sccm to 2000 sccm; and an RF bias voltage is 500 W to 600 W (0.3 W/cm$^2$ to 3.7 W/cm$^2$). More specific conditions can be set as follows: an ICP power is 500 W (0.11 W/cm$^2$); a pressure is 1.35 Pa; a gas flow rate is 100 sccm; and an RF bias voltage is 100 W (0.61 W/cm$^2$).

Further, when the above-described plasma treatment is performed, by performing precoating treatment on an inside of the chamber, a metal constituting a reaction chamber (iron (Fe), nickel (Ni), chromium (Cr), or the like) can be prevented from being attached to the surface of the base substrate 120 as an impurity. For example, by covering an inner wall of the reaction chamber as precoating treatment with an insulating film such as a silicon oxide film, a silicon film, an aluminum oxide film, or a silicon carbide (SiC) film, contamination of the surface of the base substrate 120, which accompanies the planarization treatment, can be suppressed.

As described above, by performing plasma treatment, planarity of the surface of the base substrate 120 can be improved. Even in the case where a substrate polished by CMP or the like is used as the base substrate 120, by performing plasma treatment, abrasive particles ($CeO_2$ or the like) which are left over the base substrate 120 are removed and the surface of the base substrate 120 can be planarized. As a result, planarity of a film formed over the base substrate 120 can be improved.

Note that cleaning may be performed before performing plasma treatment of the base substrate 120. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 120 using a hydrochloric acid/hydrogen peroxide mixture. Through such cleaning treatment, the surface of the base substrate 120 can be planarized and abrasive particles left over the surface of the base substrate 120 can be removed to some extent.

Next, the nitrogen-containing layer 121 is formed on the surface of the base substrate 120 (see FIG. 2B-2).

By forming the nitrogen-containing layer 121 over the base substrate 120 which is planarized through plasma treatment, the surface of the nitrogen-containing layer 121 can be planarized.

Next, at least one of the surface of the oxide film 102 formed on the semiconductor substrate 100 and the surface of the nitrogen-containing layer 121 formed over the base substrate 120 is preferably subjected to plasma treatment.

Note that, as illustrated in FIGS. 2A-1 to 2A-4, 2B-1 to 2B-3, 2C, and 2D, the surface of the oxide film 102 on the semiconductor substrate 100 and the surface of the nitrogen-containing layer 121 over the base substrate 120 may be subjected to plasma treatment (see FIGS. 2A-4 and 2B-3). By performing plasma treatment on both the oxide film 102 and the nitrogen-containing layer 121, the surfaces can be activated because of increasing of hydrophilic groups or formation of dangling bonds.

Figure 2C:
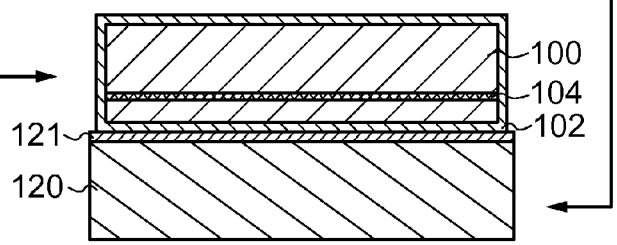
Figure 2D:
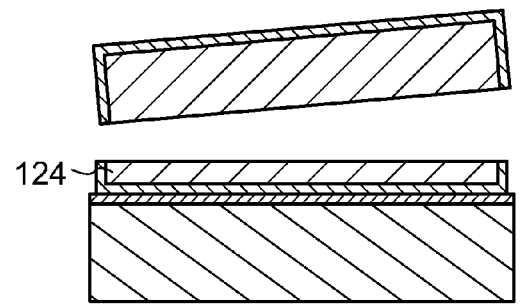

After that, the surface of the semiconductor substrate 100 and the surface of the base substrate 120 are disposed to face each other and the surface of the oxide film 102 and the surface of the nitrogen-containing layer 121 are bonded to each other (see FIG. 2C). Then, separation along the embrittled region 104 is performed by heat treatment, whereby a single crystal semiconductor layer is provided over the base substrate 120 with the oxide film 102 interposed therebetween (see FIG. 2D).

Note that the method for manufacturing an SOI substrate described in this embodiment can be combined with manufacturing methods in another embodiment in this specification, as appropriate.

Embodiment 3

In this embodiment, a method for manufacturing an SOI substrate, which is different from those in the above-described embodiments, is described with reference to the drawings. Specifically, a case where a plurality of semiconductor substrates are bonded to one base substrate is described.

Figure 3A:
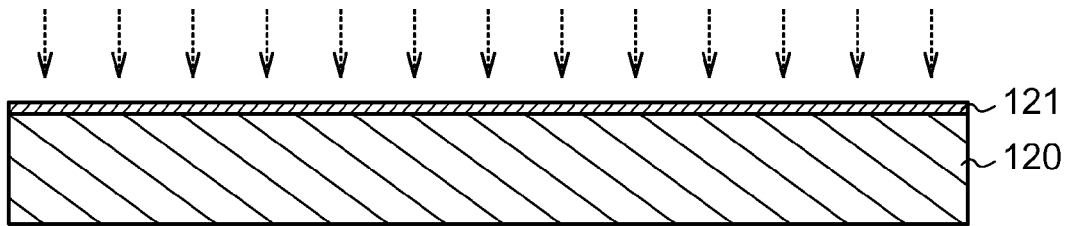
FIGS. 3A to 3D are diagrams illustrating an example of a method for manufacturing an SOI substrate.

First, the base substrate 120 is prepared. After the nitrogen-containing layer 121 is formed over the base substrate 120, plasma treatment is performed on the surface of the nitrogen-containing layer 121 (see FIG. 3A). Note that, as described in Embodiment 2, plasma treatment may be performed on the surface of the base substrate 120 in advance.

Figure 3B:
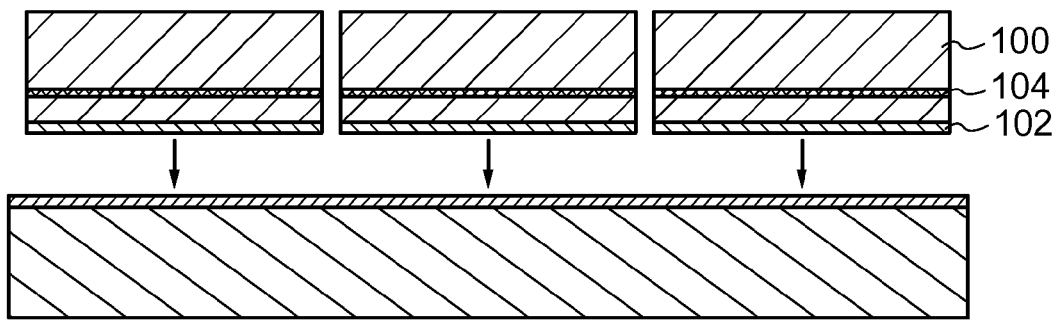
Figure 3C:
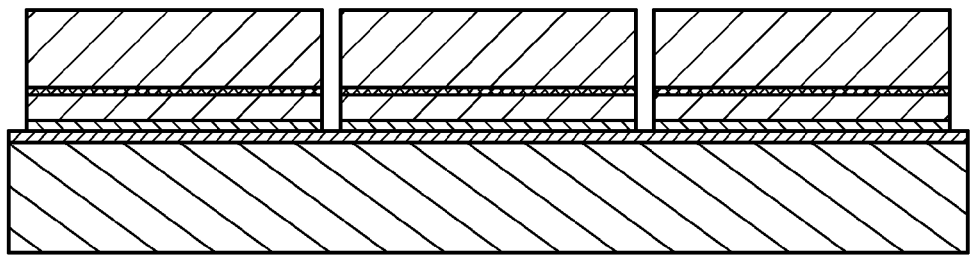

Next, a plurality of semiconductor substrates 100 each surface of which is provided with the oxide film 102 and in each of which the embrittled region 104 is provided at a predetermined depth are prepared (see FIG. 3B), and the plurality of semiconductor substrates 100 and the base substrate 120 are bonded to each other (see FIG. 3C). Here, the oxide films 102 formed on the semiconductor substrates 100 and the nitrogen-containing layer 121 formed over the base substrate 120 are bonded to each other.

Note that, here, the case where plasma treatment is performed on the surface of the nitrogen-containing layer 121 is described; however, plasma treatment may be performed on the surfaces of the oxide films 102 provided on the semiconductor substrates 100.

Figure 3D:
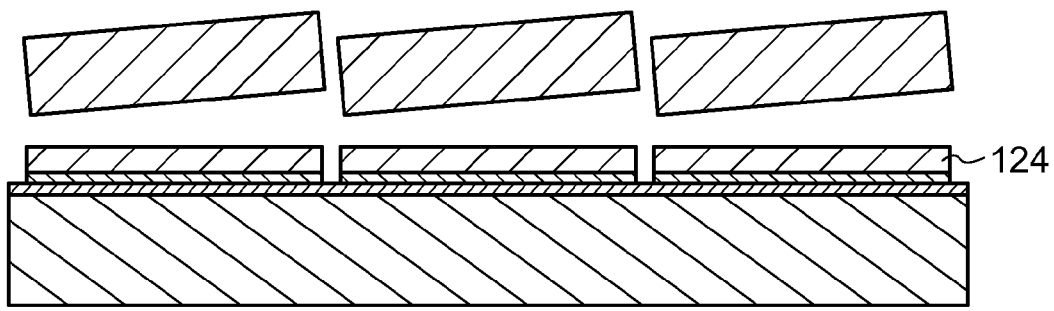

Next, heat treatment is performed to cause separation along the embrittled regions 104, whereby a plurality of single crystal semiconductor layers are each provided over the base substrate 120 with the oxide film 102 interposed therebetween (see FIG. 3D).

Thus, in the case where a plurality of semiconductor substrates are bonded to one base substrate, by forming the nitrogen-containing layer 121 functioning as a barrier layer on the base substrate 120 side whose size is large, the barrier layer can also be formed in a region where the single crystal semiconductor layer is not provided (a gap between the plurality of single crystal semiconductor layers) as compared to the case where the nitrogen-containing layer is provided only on the semiconductor substrate side. As a result, impurities can be effectively prevented from entering the single crystal semiconductor layers from the gap.

Note that the method for manufacturing an SOI substrate described in this embodiment can be combined with manufacturing methods in another embodiment in this specification, as appropriate.

Embodiment 4

In this embodiment, a method for manufacturing a semiconductor device using the SOI substrate which is manufactured according to any of the above embodiments is described.

First, a method for manufacturing an n-channel thin film transistor and a p-channel thin film transistor is described with reference to FIGS. 4A to 4D and FIGS. 5A to 5C. Various kinds of semiconductor devices can be formed by combining a plurality of thin film transistors (TFTs).

A case where the SOI substrate manufactured by the method in Embodiment 1 is used as an SOI substrate is described. It is needless to say that the SOI substrate manufactured by the method in Embodiment 2 or 3 can also be used.

Figure 4A:
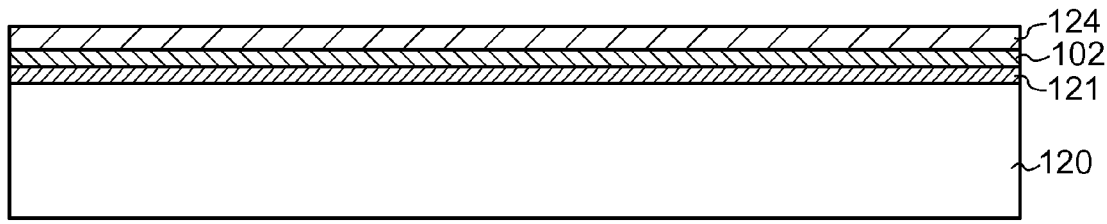
FIGS. 4A to 4D are diagrams illustrating an example of a method for manufacturing an SOI substrate.

FIG. 4A is a cross-sectional view of an SOI substrate manufactured using the method described with reference to FIGS. 1A-1 to 1A-4, 1B-1 and 1B-2, 1C, and 1D.

Figure 4B:
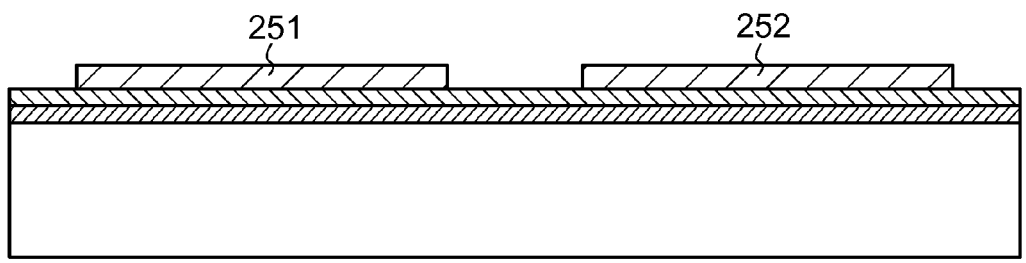

The single crystal semiconductor layer is separated into each element by etching to form semiconductor layers 251 and 252 as illustrated in FIG. 4B. The semiconductor layer 251 is included in an n-channel TFT, and the semiconductor layer 252 is included in a p-channel TFT.

Figure 4C:
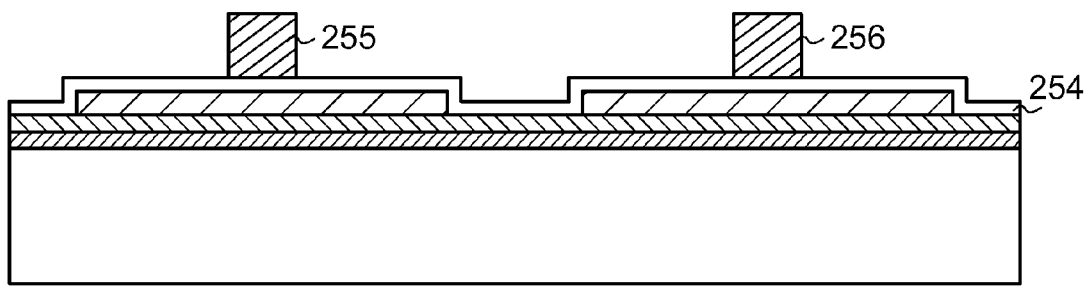

As illustrated in FIG. 4C, an insulating film 254 is formed over the semiconductor layers 251 and 252. Next, a gate electrode 255 is formed over the semiconductor layer 251 with the insulating film 254 interposed therebetween, and a gate electrode 256 is formed over the semiconductor layer 252 with the insulating film 254 interposed therebetween.

Note that, before the single crystal semiconductor layer is etched, it is preferable to add an impurity element such as boron, aluminum, or gallium or an impurity element such as phosphorus or arsenic to the single crystal semiconductor layer in order to control the threshold voltage of TFTs. For example, an impurity element is added to a region where an n-channel TFT is to be formed, and an impurity element is added to a region where a p-channel TFT is to be formed.

Figure 4D:
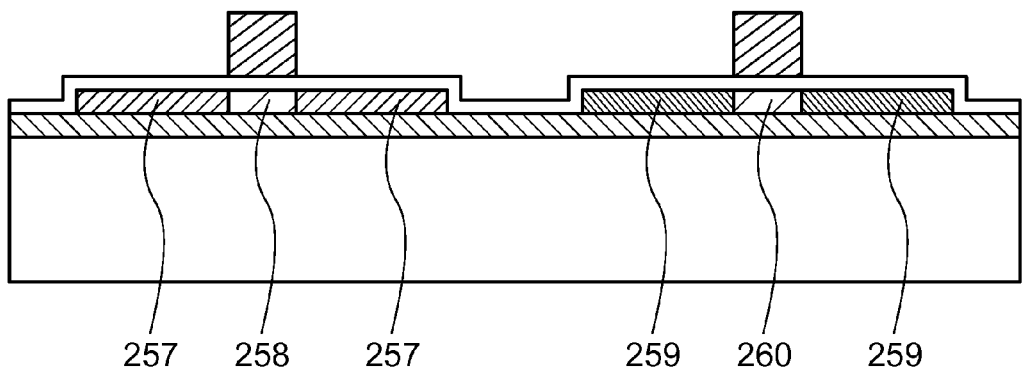

Next, as illustrated in FIG. 4D, n-type low-concentration impurity regions 257 are formed in the semiconductor layer 251, and p-type high-concentration impurity regions 259 are formed in the semiconductor layer 252. Specifically, first, the n-type low-concentration impurity regions 257 are formed in the semiconductor layer 251. In order to form the n-type low-concentration impurity regions 257, the semiconductor layer 252 where a p-channel TFT is to be formed is covered with a resist mask, and an impurity element is added to the semiconductor layer 251. As the impurity element, phosphorus or arsenic may be added. When the impurity element is added by an ion doping method or an ion implantation method, the gate electrode 255 serves as a mask, and the n-type low-concentration impurity regions 257 are formed in the semiconductor layer 251 in a self-aligned manner. A region of the semiconductor layer 251 that overlaps with the gate electrode 255 serves as a channel formation region 258.

Next, after the mask which covers the semiconductor layer 252 is removed, the semiconductor layer 251 where an n-channel TFT is to be formed is covered with a resist mask. Then, an impurity element is added to the semiconductor layer 252 by an ion doping method or an ion implantation method. As the impurity element, boron can be added. In the step of adding the impurity element, the gate electrode 256 serves as a mask, and the p-type high-concentration impurity regions 259 are formed in the semiconductor layer 252 in a self-aligned manner. The high-concentration impurity regions 259 function as a source region and a drain region. A region of the semiconductor layer 252 that overlaps with the gate electrode 256 serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 5A:
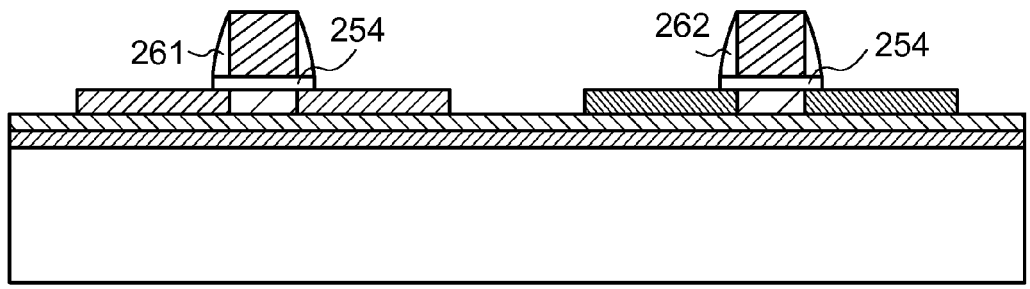
FIGS. 5A to 5C are diagrams illustrating an example of a method for manufacturing an SOI substrate.

Next, after the resist mask that covers the semiconductor layer 251 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 261 and 262 are formed in contact with side surfaces of the gate electrodes 255 and 256 respectively, as illustrated in FIG. 5A. By this anisotropic etching, the insulating film 254 is also etched.

Figure 5B:
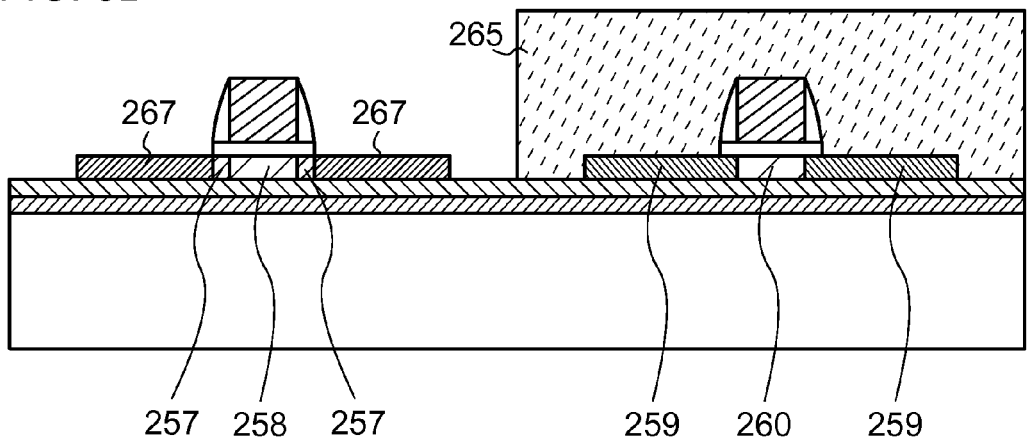

Next, as illustrated in FIG. 5B, the semiconductor layer 252 is covered with a resist 265. In order to form high-concentration impurity regions functioning as a source region and a drain region in the semiconductor layer 251, an impurity element is added to the semiconductor layer 251 at high dose by an ion implantation method or an ion doping method. The gate electrode 255 and the sidewall insulating film 261 function as a mask, and n-type high-concentration impurity regions 267 are formed. Next, heat treatment for activating the impurity elements is performed.

Figure 5C:
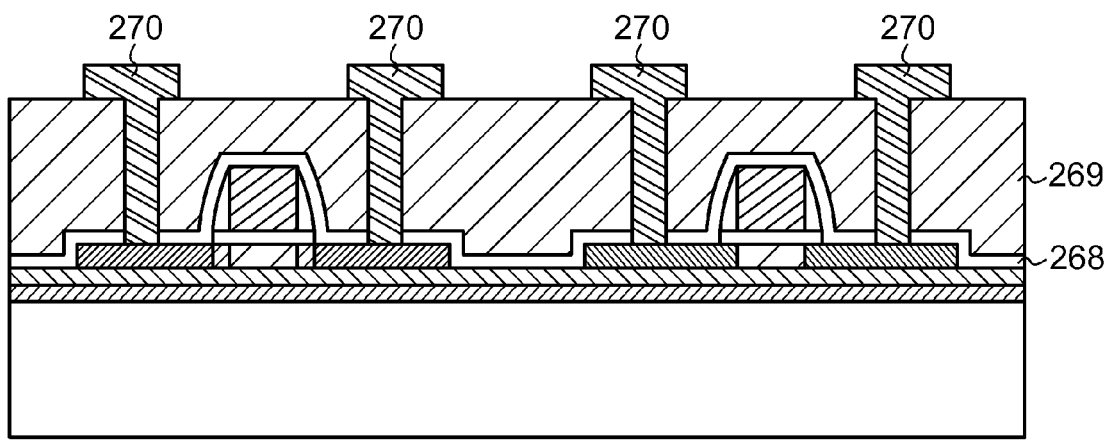

After the heat treatment for activation, an insulating film 268 containing hydrogen is formed as illustrated in FIG. 5C. After the insulating film 268 is formed, heat treatment is performed at a temperature of 350° C. to 450° C. so that hydrogen contained in the insulating film 268 diffuses into the semiconductor layers 251 and 252. The insulating film 268 can be formed by deposition of silicon nitride or silicon nitride oxide by a plasma CVD method at a process temperature of 350° C. or lower. By supply of hydrogen to the semiconductor layers 251 and 252, defects to serve as trapping centers in the semiconductor layers 251 and 252 and at the interface with the insulating film 254 can be repaired effectively.

After that, an interlayer insulating film 269 is formed. The interlayer insulating film 269 can be formed with a film having a single layer structure or a stacked layer structure selected from insulating films of inorganic materials, such as a silicon oxide film and a borophosphosilicate glass (BPSG) film, and organic resin films of polyimide, acrylic, and the like. Contact holes are formed in the interlayer insulating film 269, and wirings 270 are then formed as illustrated in FIG. 5C. The wirings 270 can be formed with a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the steps described above, a semiconductor device having the n-channel TFT and the p-channel TFT can be manufactured. Because the metal element concentration of the semiconductor layer in which the channel formation region is formed is reduced in the manufacturing process of the SOI substrate, a TFT with small off current and suppressed threshold voltage variation can be manufactured.

Although the method for manufacturing TFTs is described with reference to FIGS. 4A to 4D and FIGS. 5A to 5C, a semiconductor device with high added value can be manufactured by forming a variety of semiconductor elements such as a capacitor or a resistor as well as a TFT. Hereinafter, specific modes of semiconductor devices will be described with reference to the drawings.

Figure 6:
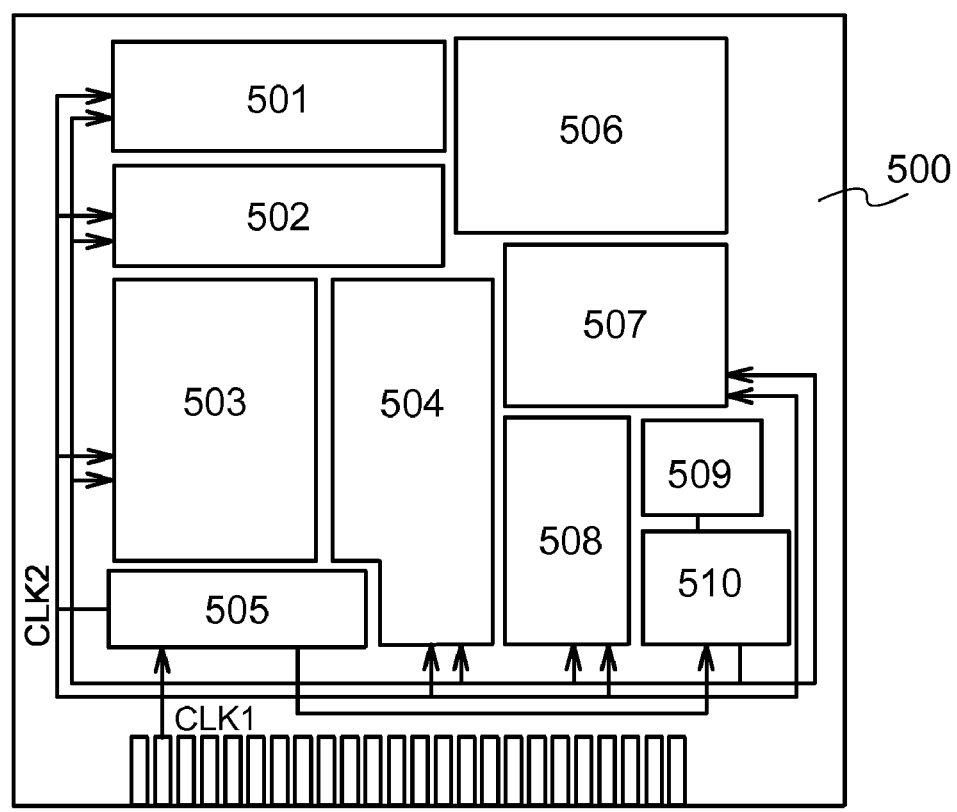
FIG. 6 is a diagram illustrating an example of a semiconductor device using an SOI substrate.

First, a microprocessor is described as an example of semiconductor devices. FIG. 6 is a block diagram illustrating an example of a structure of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
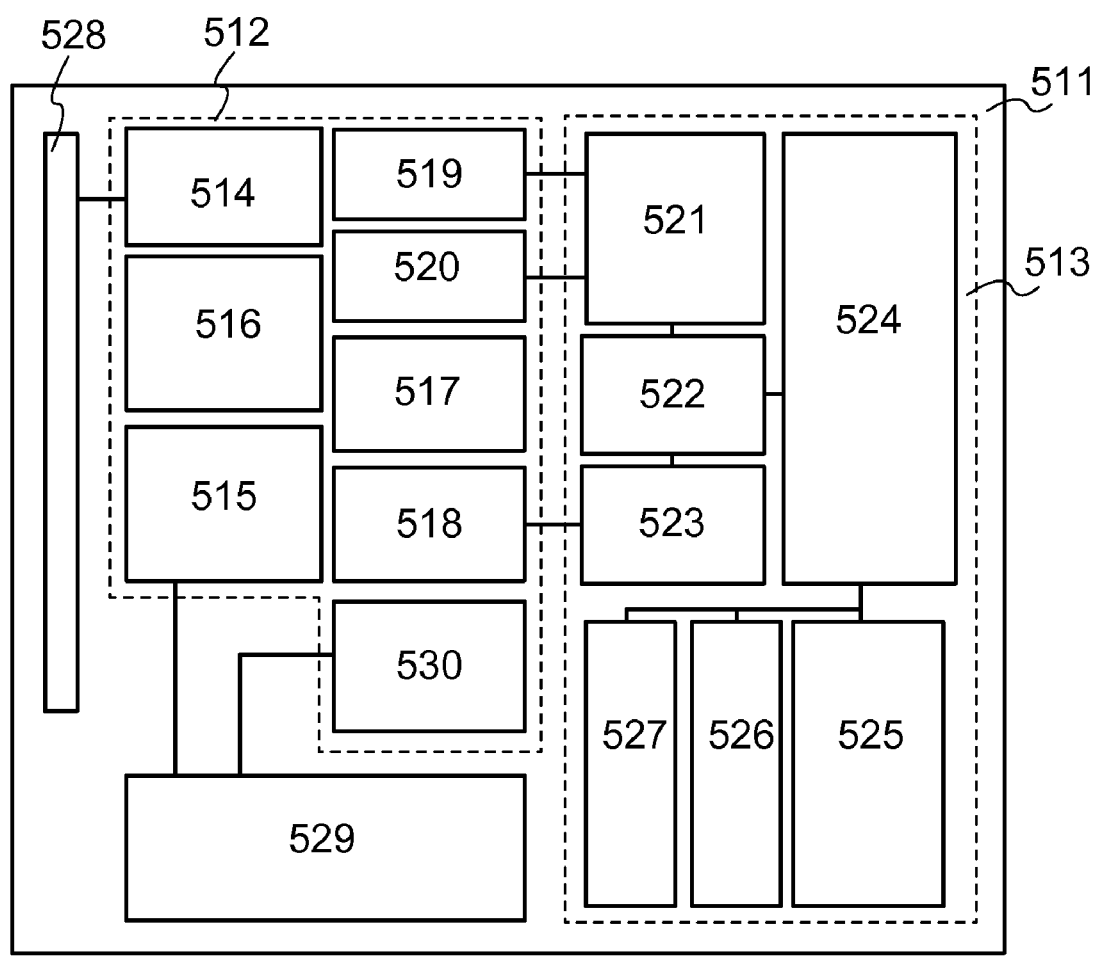
FIG. 7 is a diagram illustrating an example of a semiconductor device using an SOI substrate.

Next, an example of a semiconductor device having an arithmetic function and a contactless data transmission and reception function is described. FIG. 7 is a block diagram illustrating an example of a structure of such a semiconductor device. A semiconductor device illustrated in FIG. 7 can be called a computer that operates to transmit and receive signals to and from an external device by wireless communication (such a computer is hereinafter referred to as an "RFCPU").

As illustrated in FIG. 7, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, a CPU interface 524, a central processing unit 525, a random-access memory 526, and a read-only memory 527.

The operation of the RFCPU 511 is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 does not need to be formed over a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed with a low-pass filter and binarizes a received amplitude-modulated (ASK) signal based on its amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or a consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described with reference to FIGS. 8A and 8B and FIGS. 9A and 9B.

Figure 8A:
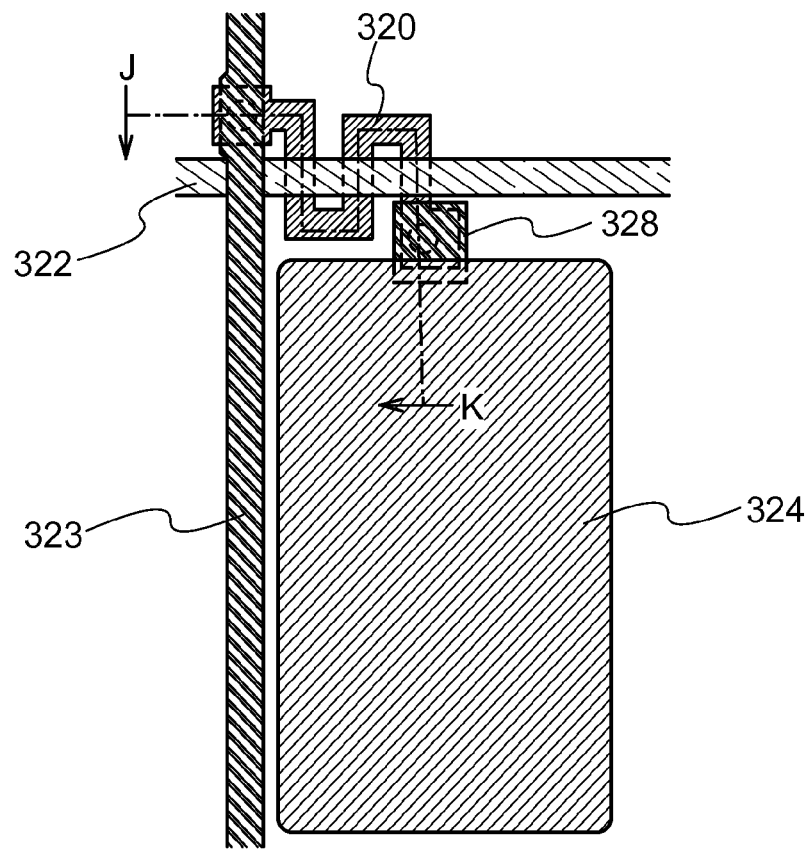
FIGS. 8A and 8B are diagrams illustrating an example of a display device using an SOI substrate.
Figure 8B:
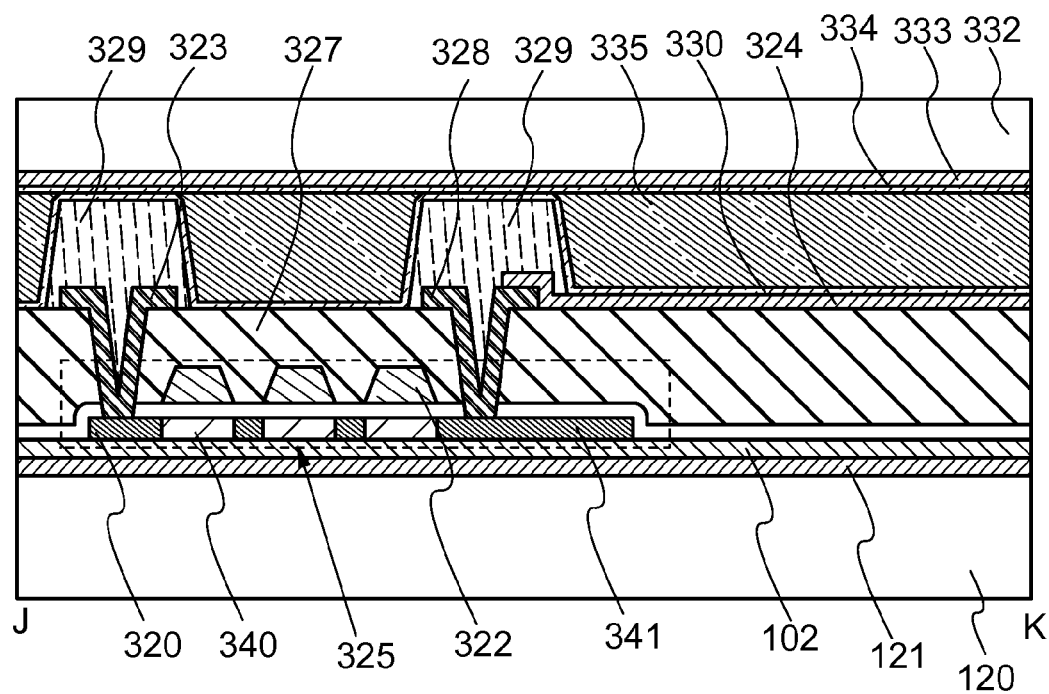

FIGS. 8A and 8B are drawings for describing a liquid crystal display device. FIG. 8A is a plan view of a pixel of the liquid crystal display device, and FIG. 8B is a cross-sectional view taken along a section line J-K in FIG. 8A.

As illustrated in FIG. 8A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer provided over the base substrate 120 and is included in a TFT 325 of the pixel.

As an SOI substrate, the SOI substrate described in any of the embodiments is used. As illustrated in FIG. 8B, the single crystal semiconductor layer 320 is stacked over the base substrate 120 with the oxide film 102 and the nitrogen-containing layer 121 interposed therebetween. As the base substrate 120, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 120 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

Figure 9A:
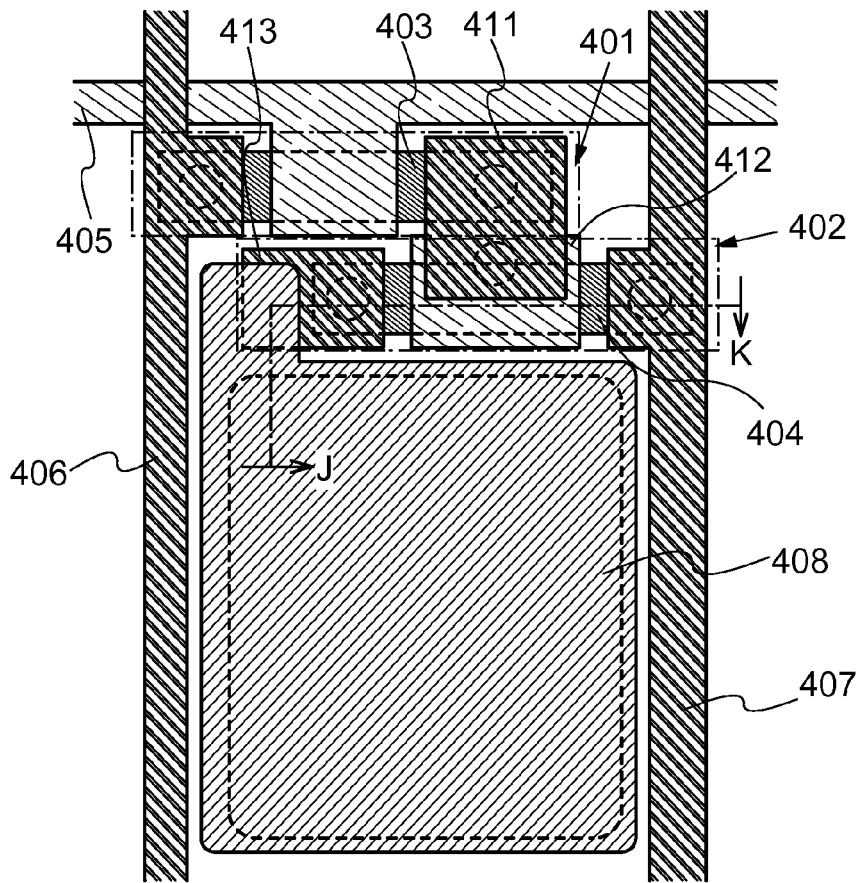
FIGS. 9A and 9B are diagrams illustrating an example of a display device using an SOI substrate.
Figure 9B:
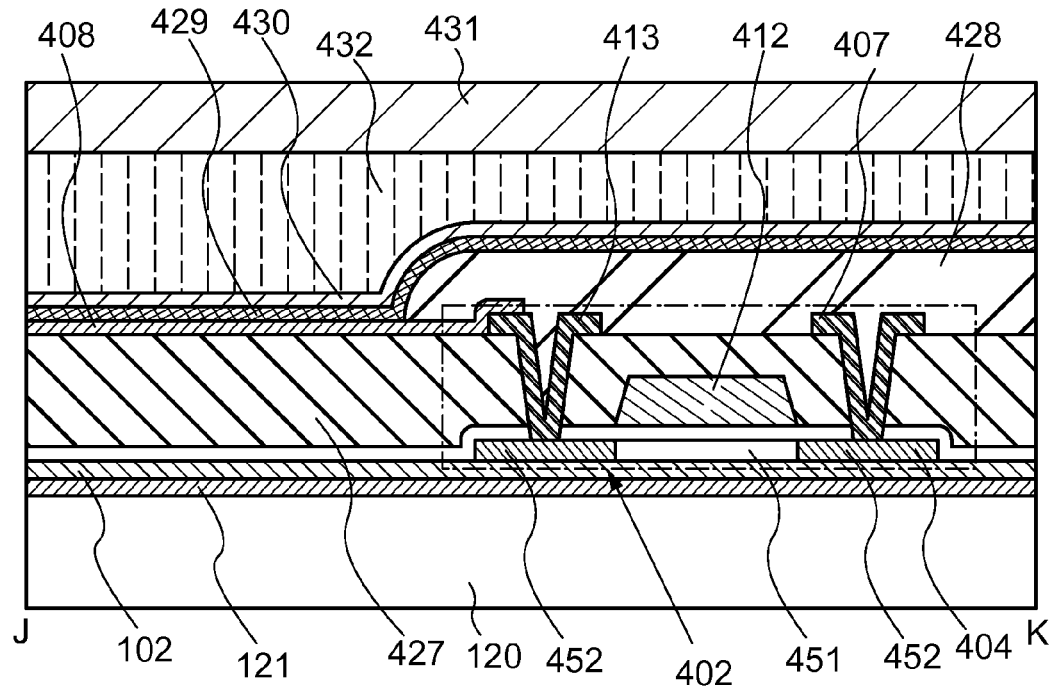

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view taken along a section line J-K in FIG. 9A.

As illustrated in FIG. 9A, the pixel includes a selecting transistor 401 and a display control transistor 402 that are TFTs, a scan line 405, a signal line 406, a current supply line 407, and a pixel electrode 408. Each pixel is provided with a light-emitting element having a structure in which a layer containing an electroluminescent material (EL layer) is interposed between a pair of electrodes. One of the electrodes of the light-emitting element is the pixel electrode 408. In a semiconductor layer 403, a channel formation region, a source region, and a drain region of the selecting transistor 401 are formed. In a semiconductor layer 404, a channel formation region, a source region, and a drain region of the display control transistor 402 are formed. The semiconductor layers 403 and 404 are formed of a single crystal semiconductor layer 320 that is provided over the base substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other is included in the current supply line 407.

The display control transistor 402 is a p-channel TFT. As illustrated in FIG. 9B, in the semiconductor layer 404, a channel formation region 451 and p-type high-concentration impurity regions 452 are formed. Note that, as the SOI substrate, the SOI substrate manufactured in any of the embodiments is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 120 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which largely vary from pixel to pixel. In order to employ the current drive method, a correction circuit which corrects characteristic variation is needed. When the EL display device is manufactured by a manufacturing method including a manufacturing process of an SOI substrate, the selecting transistor 401 and the display control transistor 402 do not have variation in electrical characteristics from pixel to pixel. Accordingly, the current drive method can be employed.

That is, various electronic devices can be manufactured by using SOI substrates. Examples of electronic devices include: cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices that are each capable of reproducing audio data stored in a recording medium such as a digital versatile disc (DVD) and that each have a display device capable of displaying image data stored therein); and the like. An example of them is illustrated in FIGS. 10A to 10C.

Figure 10A:
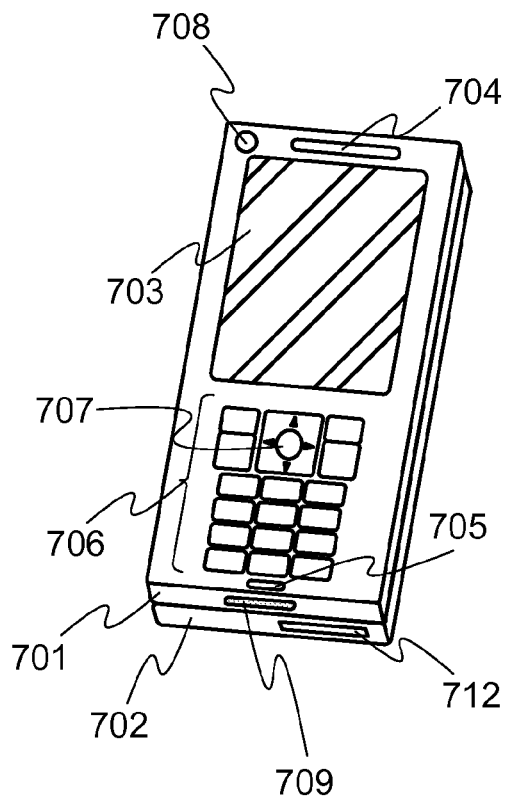
FIGS. 10A to 10C are diagrams illustrating an electronic device using an SOI substrate.
Figure 10B:
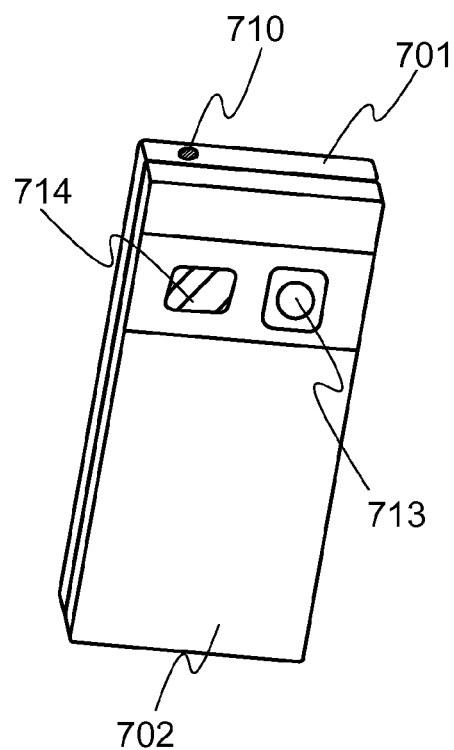
Figure 10C:
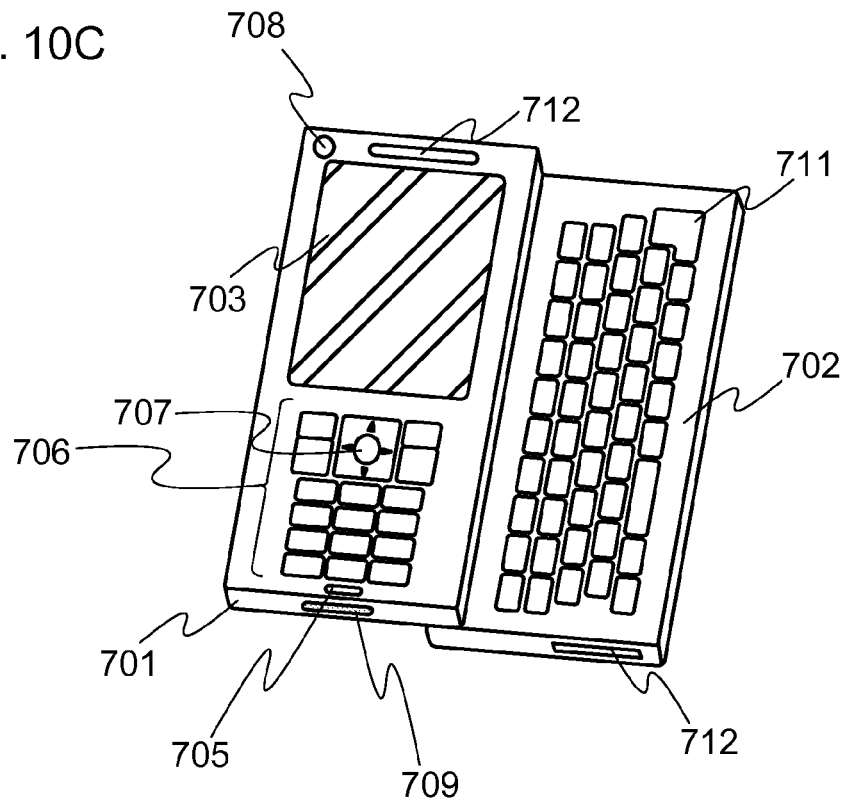

FIGS. 10A to 10C illustrate an example of a cellular phone. FIG. 10A is a front view; FIG. 10B, a rear view; and FIG. 10C, a front view in which two housings are slid. The cellular phone in FIGS. 10A to 10C has two housings, a housing 701 and a housing 702. The cellular phone in FIGS. 10A to 10C is a so-called smartphone that has both a function as a cellular phone and a function as a portable information terminal and incorporates a computer provided to conduct a variety of data processing besides voice calls.

The cellular phone in FIGS. 10A to 10C has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above components, the cellular phone in FIGS. 10A to 10C may incorporate a contactless IC chip, a small size memory device, or the like.

The housings 701 and 702 which are put together to be lapped with each other (illustrated in FIG. 10A) can be developed by sliding as illustrated in FIG. 10C. The display portion 703 can incorporate a display panel or a display device to which the method for manufacturing the display device described in Embodiment 2 or 3 is applied. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone in FIGS. 10A to 10C can be used as a sound recording device (recorder) or a sound reproducing device. By operation with the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. The housings 701 and 702 which are put together to be lapped with each other (FIG. 10A) can be developed by sliding as illustrated in FIG. 10C. When the cellular phone is used as a portable information terminal, smooth cursor operation can be conducted using the keyboard 711 or the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The housing 702 is provided with the rear-face camera 713 and the light 714 on the rear face (FIG. 10B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

The electronic device illustrated in FIGS. 10A to 10C can be manufactured by application of the aforementioned method for manufacturing a transistor and a display device.

EXAMPLE 1

In this example, changes in surface characteristics when a surface of an oxide film formed on a semiconductor substrate is subjected to plasma treatment are described.

First, in this example, a plurality of samples (Samples ($A_1$) to ($D_1$)) were manufactured under different conditions, and contact angles of surfaces of oxide films of Samples ($A_1$) to ($D_1$) were measured. Note that the contact angle is an angle θ made by a formation surface and a tangent line of a liquid drop at an edge of dropped dots, and the smaller the contact angle is, the higher hydrophilicity of the surface becomes.

As Sample ($A_1$), an oxide film having a thickness of 100 nm was formed on a single crystal silicon substrate.

As Sample ($B_1$), after an oxide film having a thickness of 100 nm was formed on a single crystal silicon substrate, a semiconductor substrate was irradiated with hydrogen ions through the oxide film.

As Sample ($C_1$), after an oxide film having a thickness of 100 nm was formed on a single crystal silicon substrate, a semiconductor substrate was irradiated with hydrogen ions through the oxide film and a surface of the oxide film was subjected to plasma treatment.

As Sample ($D_1$), after an oxide film having a thickness of 100 nm was formed on a single crystal silicon substrate, a semiconductor substrate was irradiated with hydrogen ions through the oxide film and a surface of the oxide film was processed with ozone water.

Note that, in Samples $A_1$ to $D_1$, the oxide films were formed by performing oxidation treatment on the single crystal silicon substrates in an oxidizing atmosphere containing hydrogen chloride (HCl) at 3 volume % with respect to oxygen at a temperature of 950° C. for 200 minutes. Further, irradiation with hydrogen ions was performed with an ion doping apparatus under the following conditions: the power supply output was 100 W; the accelerating voltage, 40 kV; and the dose, $2.2 \times 10^{16}$ ions/cm$^3$. Further, plasma treatment was performed under the following conditions: an apparatus manufactured by Tegal Corporation (981ACS, a plasma dry etching apparatus) was used; a reactive ion etching (RIE) mode was employed; the electric power used for the treatment was 0.62 W; the pressure was 66.7 Pa; the gas ($O_2$) flow rate was 100 sccm; and the treatment time was 30 seconds (see FIG. 11).

Table 1 shows measurement results of the contact angles of the oxide films of Samples ($A_1$) to ($D_1$).

TABLE 1

| | Treatments | Contact angle (degree) |
|---|---|---|
| Sample ($A_1$) | Si\SiO$_2$ (HCl) | 37.3 |
| Sample ($B_1$) | Si\SiO$_2$ (HCl)\H dope | 16.7 |
| Sample ($C_1$) | Si\SiO$_2$ (HCl)\H dope\Plasma treatment | <4.0 |
| Sample ($D_1$) | Si\SiO$_2$ (HCl)\H dope\Ozone water treatment | 7.2 |

It was confirmed that by performing plasma treatment or ozone water treatment on the surface of the oxide film, hydrophilicity of the surface of the oxide film can be improved. In particular, it was confirmed that by performing plasma treatment on the surface of the oxide film, the contact angle became smaller than 4° (smaller than or equal to the minimum limit of detection), and the hydrophilicity can be effectively improved.

Next, measurement results of changes in the amounts of water included in the oxide films depending on whether plasma treatment was performed on the oxide films formed on the semiconductor substrates are described.

First, as in the foregoing, after Samples ($A_1$) to ($D_1$) were manufactured, the amounts of water in the oxide films of Samples ($A_1$) to ($D_1$) were measured. The measurement was conducted by thermal desorption spectroscopy (TDS). TDS is spectroscopy in which a sample for measurement is heated and molecules of a gas released from the sample are measured at each temperature.

Figure 13:
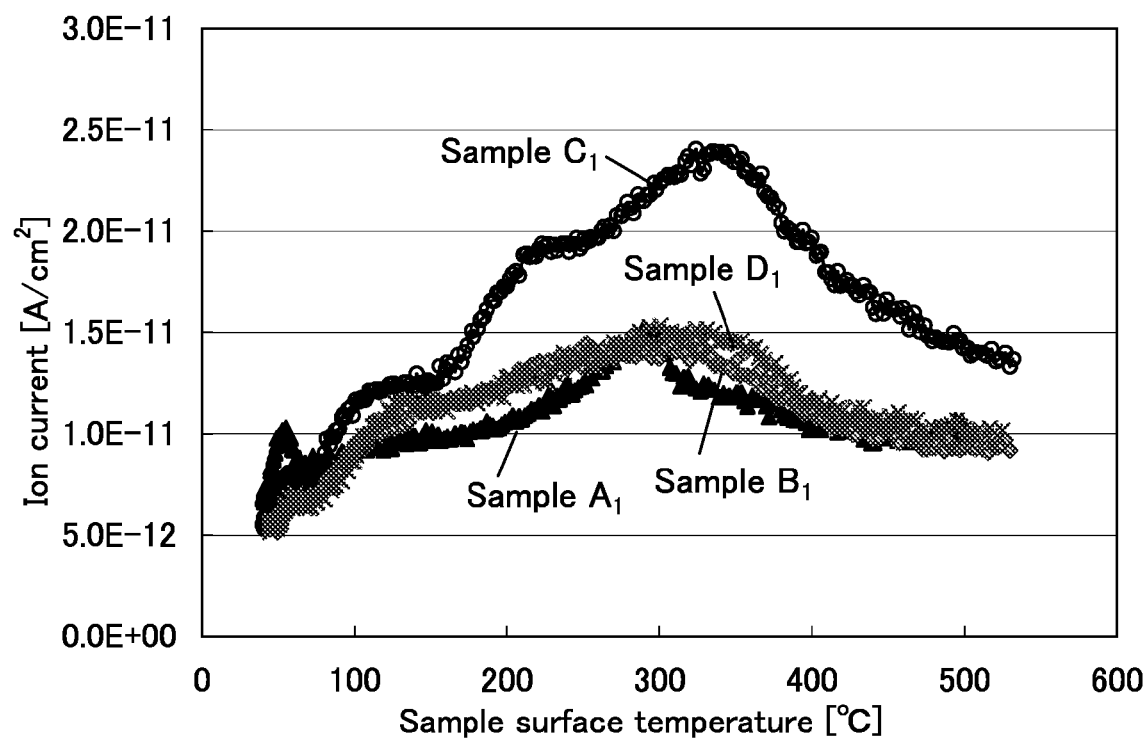
FIG. 13 is a graph showing amount of moisture discharged from an oxide film formed on a semiconductor substrate.
Figure 14A:
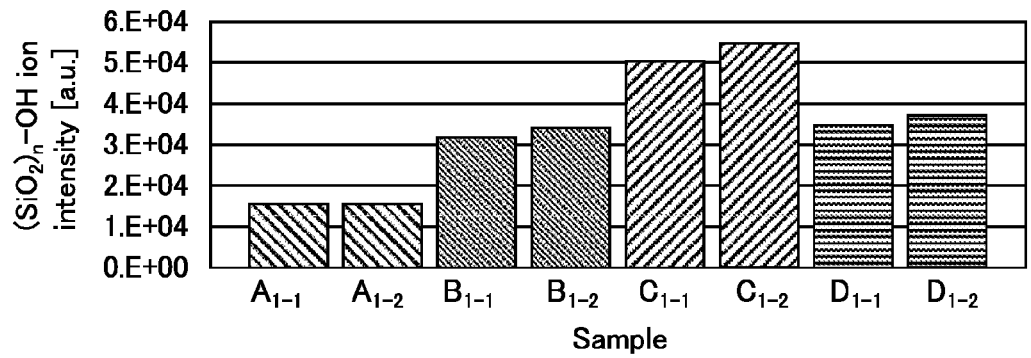
FIGS. 14A to 14D are graphs each showing measurement results of ToF-SIMS of an oxide film formed on a single crystal silicon substrate.
Figure 14B:
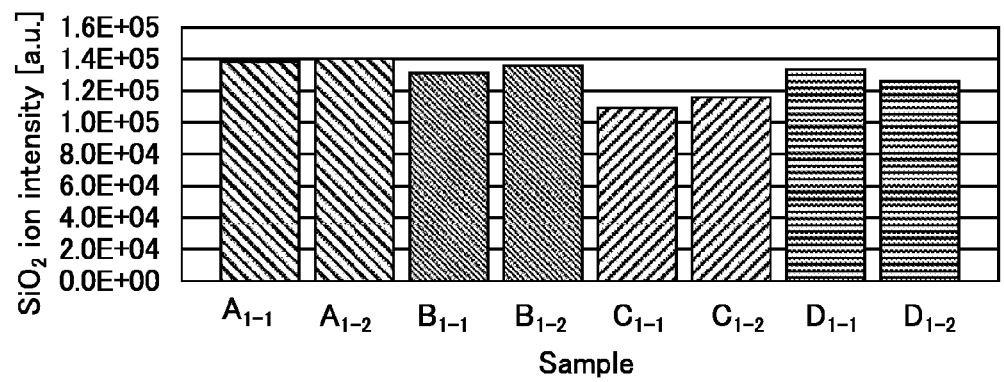
Figure 14C:
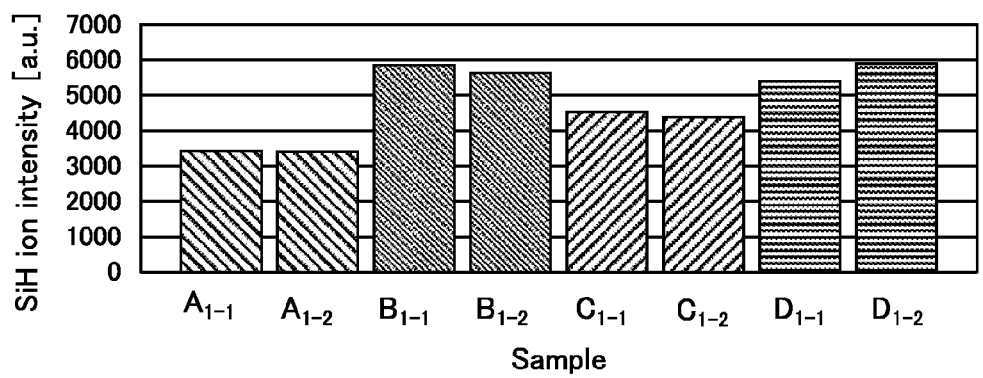
Figure 14D:
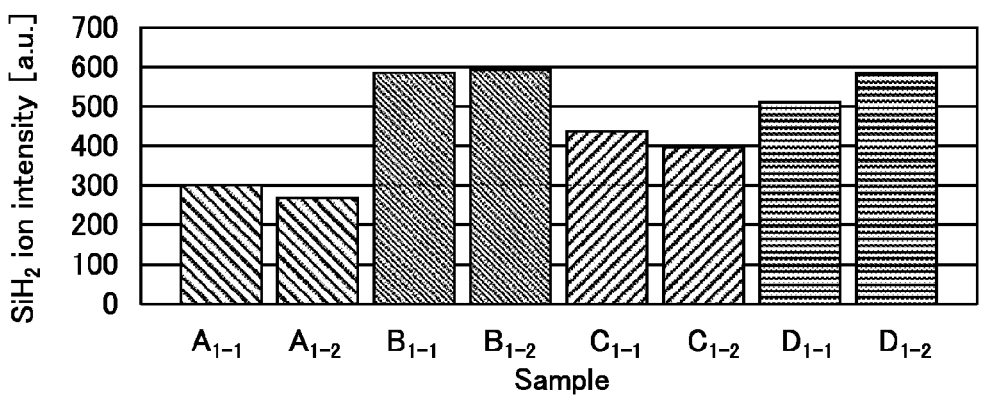
Figure 15A:
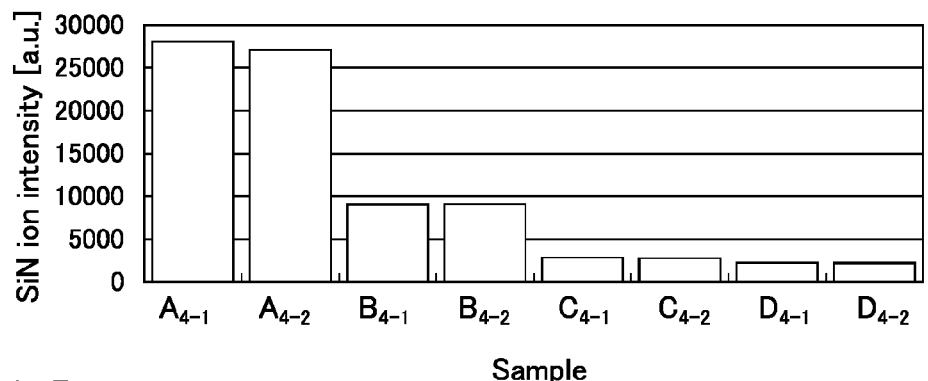
FIGS. 15A to 15D are graphs each showing measurement results of ToF-SIMS of an oxide film formed on a glass substrate.
Figure 15B:
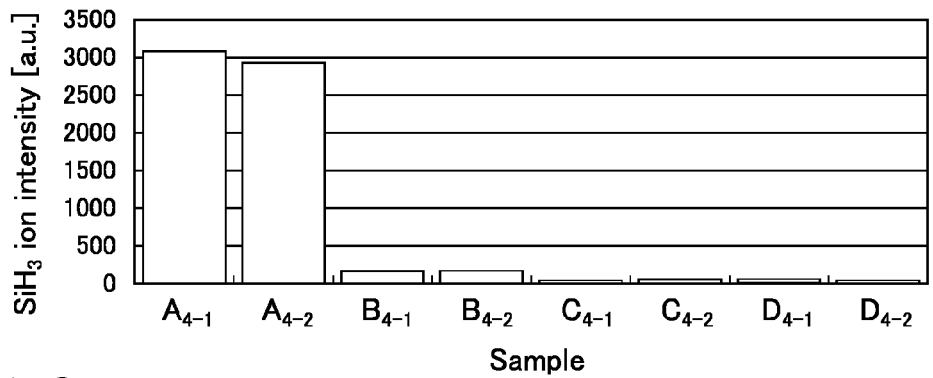
Figure 15C:
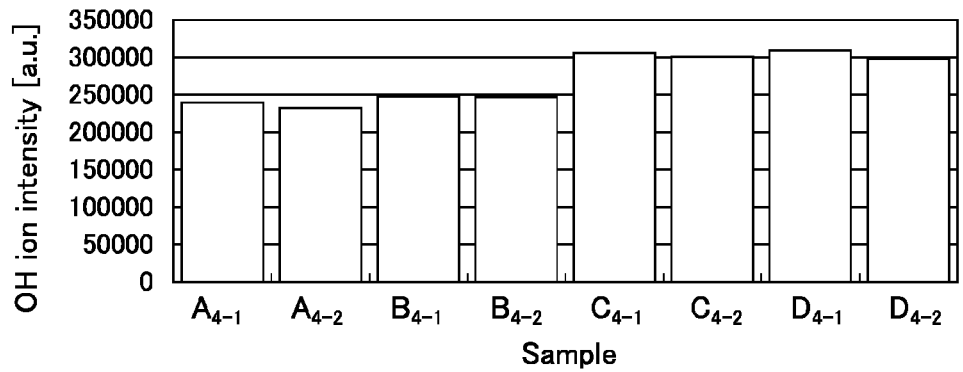
Figure 15D:
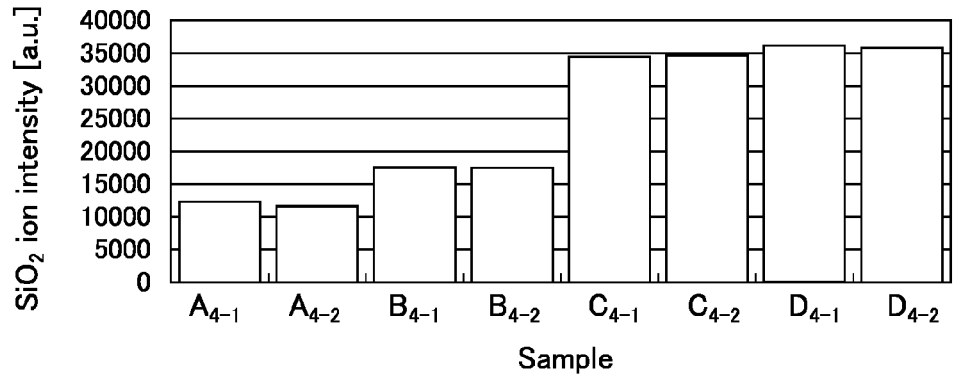

FIG. 13 shows measurement results. A larger amount of $H_2O$ was released from the sample (Sample ($C_1$)) which was subjected to plasma treatment than from the samples (Samples ($A_1$) and ($B_1$)) which were not subjected to plasma treatment and the sample (Sample ($D_1$)) which was subjected to ozone water treatment instead of plasma treatment. That is, it was confirmed that by performing plasma treatment on the oxide film, $H_2O$ and OH increased in the oxide film.

Next, surface conditions of the oxide films depending on whether plasma treatment was performed on the surfaces of the oxide films formed on the semiconductor substrates were analyzed by qualitative analysis by time of flight-secondary ion mass spectrometry (ToF-SIMS).

First, after Samples ($A_1$) to ($D_1$) were manufactured under four conditions described above, qualitative analysis was performed by ToF-SIMS.

In FIGS. 14A to 14D, analysis results of the surfaces of the oxide films in Samples ($A_1$) to ($D_1$) are shown. Note that, in this example, two samples were manufactured for each of the samples (Samples ($A_1$) to ($D_1$)) and measurement was conducted.

It was confirmed that the oxide film of Sample ($C_1$), which was subjected to the plasma treatment, had higher intensity of $(SiO_2)_n$—OH-based ions than the other samples, which were not subjected to the plasma treatment (FIGS. 14A to 14D).

That is, it was confirmed that collision between accelerated oxygen cations and a surface of an oxide film reduces Si—H, Si—H$_2$, and SiO$_2$ on the surface of the oxide film, and increases (SiO$_2$)$_n$—OH thereon.

Next, measurement results of surface energy of the oxide films depending on whether plasma treatment was performed on the oxide films formed on the semiconductor substrates are described.

First, after Samples (A$_2$) to (D$_2$) were manufactured under the following four conditions, measurement of surface energy of the oxide films of Samples (A$_2$) to (D$_2$) was performed by a blade method.

As Sample (A$_2$), an oxide film having a thickness of 100 nm was formed on a single crystal silicon substrate.

As Sample (B$_2$), after an oxide film having a thickness of 100 nm was formed on a single crystal silicon substrate, a semiconductor substrate was irradiated with hydrogen ions through the oxide film.

As Sample (C$_2$), after an oxide film having a thickness of 100 nm was formed on a single crystal silicon substrate, the oxide film was subjected to plasma treatment.

As Sample (D$_2$), after an oxide film having a thickness of 100 nm was formed on a single crystal silicon substrate, a semiconductor substrate was irradiated with hydrogen ions through the oxide film, and then, a surface of the oxide film was subjected to plasma treatment.

Note that, in Samples (A$_2$) to (D$_2$), formation of the oxide films was performed in a similar manner to manufacture of the above-described Samples (A$_1$) to (D$_1$), and conditions of hydrogen ion irradiation and plasma treatment were set in a similar manner to manufacture of the above-described Samples (A$_1$) to (D$_1$).

Note that the blade method is a method in which an oxide film formed on a first substrate (here, the single crystal silicon substrate) and a second substrate (for example, a glass substrate over which a silicon nitride oxide films is formed) are bonded to each other, and then, surface energy (γ) is calculated in accordance with the following formula on the basis of distance L from an edge into which a blade is inserted to an interface where a crack is caused when the blade is inserted between the single crystal silicon substrate and the glass substrate.

$$\gamma = \frac{3t_b^2 E_1 t_{w1}^3 E_2 t_{w2}^3}{16 L^4 (E_1 t_{w1}^3 + E_2 t_{w2}^3)}$$

Figure 17:
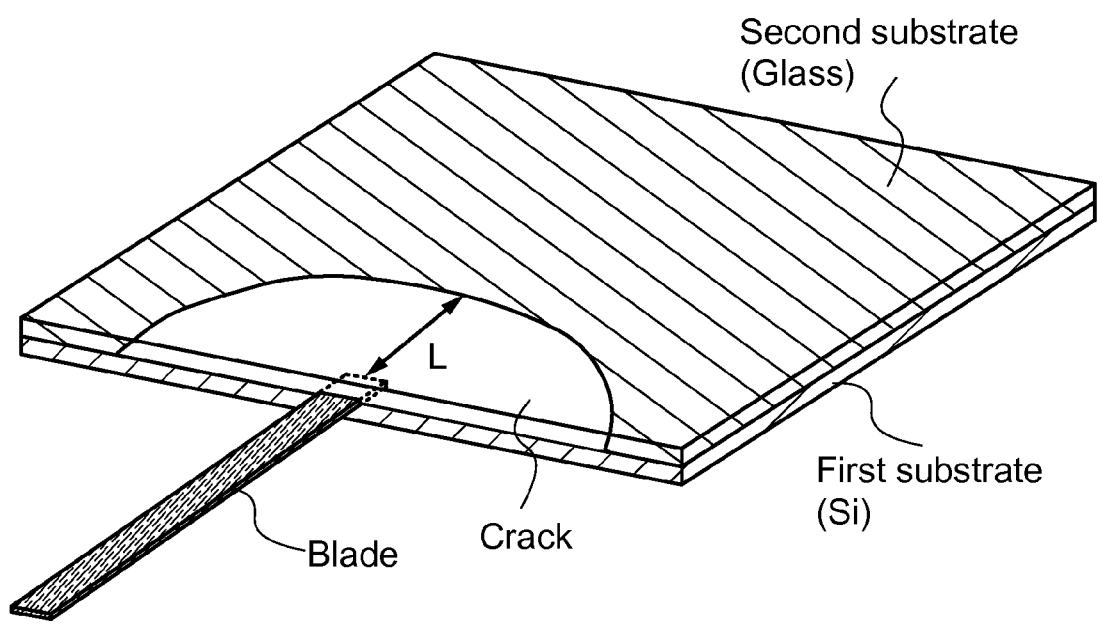
FIG. 17 is a diagram illustrating a blade method.

Note that, in the above-described formula, $t_b$ represents the thickness of the blade, $E_1$ represents Young's modulus of the first substrate, $E_2$ represents Young's modulus of the second substrate, $t_{w1}$ represents the thickness of the first substrate, $t_{w2}$ represents the thickness of the second substrate, and L represents the distance between an end of the blade and a crack interface (see FIG. 17).

Table 2 shows measurement results of the surface energy (mJ/m$^2$) of the oxide films of Samples (A$_2$) to (D$_2$).

TABLE 2

|  | Treatments | Surface energy (mJ/m$^2$) |
|---|---|---|
| Sample (A$_2$) | Si\SiO$_2$ (HCl) | 486 |
| Sample (B$_2$) | Si\SiO$_2$ (HCl)\H dope | 869 |
| Sample (C$_2$) | Si\SiO$_2$ (HCl)\Plasma treatment | 1385 |
| Sample (D$_2$) | Si\SiO$_2$ (HCl)\H dope\Ozone water treatment | 1582 |

It was confirmed that by performing irradiation with hydrogen ions and plasma treatment, the surface energy of the surface of the oxide film was increased. In particular, it was confirmed that by performing plasma treatment, the surface energy of the surface of the oxide film was able to be increased, and in the case where plasma treatment was performed after irradiation with hydrogen ions, the surface energy of the surface of the oxide film became the highest.

EXAMPLE 2

In this example, changes in surface characteristics when a surface of a nitrogen-containing layer formed over a base substrate is subjected to plasma treatment are described.

First, in this example, a plurality of samples (Samples (A$_3$) to (D$_3$)) were manufactured under different conditions, and contact angles of nitrogen-containing layers of Samples (A$_3$) to (D$_3$) were measured before and after plasma treatment.

As Sample (A$_3$), a silicon nitride oxide film having a thickness of 50 nm was formed over a glass substrate.

As Sample (B$_3$), after a silicon nitride oxide film having a thickness of 50 nm was formed over a glass substrate, a surface of the silicon nitride oxide film was subjected to plasma treatment in a nitrogen atmosphere.

As Sample (C$_3$), after a silicon nitride oxide film having a thickness of 50 nm was formed over a glass substrate, a surface of the silicon nitride oxide film was subjected to plasma treatment in an atmosphere of nitrogen and oxygen.

As Sample (D$_3$), after a silicon nitride oxide film having a thickness of 50 nm was formed over a glass substrate, a surface of the silicon nitride oxide film was processed with ozone water.

Note that, in Samples (A$_3$) to (D$_3$), the silicon nitride oxide films were formed by a plasma CVD method. Further, plasma treatment (here, atmospheric plasma treatment) was performed under the following conditions: an apparatus manufactured by SUSS MicroTec Co., Ltd. was used; the electric power used for the treatment was 200 W; and the scan rate was 10 mm/sec (see FIG. 12). Note that, as a nitrogen atmosphere, the flow rate of nitrogen was 50 L/min, and as an atmosphere of nitrogen and oxygen, the flow rate of nitrogen was 40 L/min and the flow rate of oxygen was 30 L/min.

Table 3 shows measurement results of the contact angles of the oxide films of Samples (A$_3$) to (D$_3$).

TABLE 3

|  | Treatments | Contact angle (degree) |
|---|---|---|
| Sample (A$_3$) | Glass\SiNO | 53.0 |
| Sample (B$_3$) | Glass\SiNO\Plasma treatment (in N$_2$) | <4.0 |
| Sample (C$_3$) | Glass\SiNO\Plasma treatment (in N$_2$ + O$_2$) | <4.0 |
| Sample (D$_3$) | Glass\SiNO\Ozone water treatment | 38.7 |

It was confirmed that by performing plasma treatment or ozone water treatment on the surface of the silicon nitride oxide film, hydrophilicity of the silicon nitride oxide film was able to be improved. In particular, by performing plasma treatment on the surface of the silicon nitride oxide film, the contact angle became smaller than 4° (smaller than or equal to the minimum limit of detection), and the hydrophilicity was be able to be effectively improved.

Next, surface conditions of the oxide films depending on whether plasma treatment was performed on the surfaces of the oxide films formed on the semiconductor substrates were analyzed by qualitative analysis by time of flight-secondary ion mass spectrometry (ToF-SIMS).

First, after Samples ($A_4$) to ($D_4$) were manufactured under the following conditions, qualitative analysis was performed by ToF-SIMS.

As Sample ($A_4$), a silicon nitride oxide film having a thickness of 50 nm was formed over a glass substrate.

As Sample ($B_4$), after a silicon nitride oxide film having a thickness of 50 nm was formed over a glass substrate, a surface of the silicon nitride oxide film was subjected to plasma treatment under the following conditions: in an atmosphere of nitrogen and oxygen, electric power used for the treatment was 200 W.

As Sample ($C_4$), after a silicon nitride oxide film having a thickness of 50 nm was formed over a glass substrate, a surface of the silicon nitride oxide film was subjected to plasma treatment under the following conditions; in an atmosphere of nitrogen and oxygen, electric power used for the treatment was 500 W.

As Sample ($D_4$), after a silicon nitride oxide film having a thickness of 50 nm was formed over a glass substrate, a surface of the silicon nitride oxide film was subjected to plasma treatment under the following condition: in a nitrogen atmosphere, electric power used for the treatment was 500 W.

In FIGS. 15A to 15D, measurement results of the surfaces of the oxide films of Samples ($A_4$) to ($D_4$) are shown. Note that, in this example, two samples were manufactured for each of the samples (Samples ($A_4$) to ($D_4$)) and measurement was conducted.

It was confirmed that the silicon nitride oxide films of Samples ($B_4$) to ($D_4$), which were subjected to plasma treatment, had lower intensity of SiN ions and $SiH_3$ ions and higher intensity of OH ions and $SiO_2$ ions than the other Sample ($A_4$) which was not subjected to plasma treatment (FIGS. 15A to 15D). That is, it was confirmed that by performing plasma treatment, SiN and $SiH_3$ of the silicon nitride oxide film were reduced and SiOx having hydrophilicity was able to be increased. Further, it was confirmed that by increasing electric power used for the plasma treatment, SiN and $SiH_3$ of the silicon nitride oxide film can be reduced more effectively and SiOx having hydrophilicity can be increased.

Next, measurement results of the surface energy of the oxide films depending on whether plasma treatment was performed on the oxide films formed on the semiconductor substrates are described.

First, after Samples ($A_4$) to ($D_4$) were manufactured under the above-described conditions, measurement of surface energy of the silicon nitride oxide films of Samples ($A_4$) to ($D_4$) was performed by a blade method.

Table 4 shows measurement results of the surface energy of the oxide films of Samples ($A_4$) to ($D_4$).

TABLE 4

| | Treatments | Surface energy (mJ/m²) |
|---|---|---|
| Sample ($A_4$) | Glass\SiNO | 1047 |
| Sample ($B_4$) | Glass\SiNO\Plasma treatment (200 W, in $N_2 + O_2$) | 1377 |
| Sample ($C_4$) | Glass\SiNO\Plasma treatment (500 W, in $N_2 + O_2$) | 1951 |
| Sample ($D_4$) | Glass\SiNO\Plasma treatment (500 W, in $N_2$) | 1625 |

It was confirmed that by performing plasma treatment on the surface of the silicon nitride oxide film, surface energy of the surface of the silicon nitride oxide film was able to be improved. In particular, by increasing electric power used for the plasma treatment, the surface energy of the surface of the silicon nitride oxide film was able to be more increased.

EXAMPLE 3

In this example, a state of a semiconductor layer, depending on whether a surface of an oxide film formed on a semiconductor substrate is subjected to plasma treatment, which is obtained over a base substrate in such a manner that after bonding the oxide film formed on the semiconductor substrate and a nitrogen-containing layer formed over the base substrate to each other, separation is performed is described.

First, a single crystal silicon substrate was prepared, and an oxide film was formed thereon. Next, irradiation with hydrogen ions was performed, whereby an embrittled region was formed. In addition, a glass substrate was prepared, and a silicon nitride oxide film was formed over the glass substrate. Then, after the oxide film formed on the single crystal silicon substrate was subjected to plasma treatment, the oxide film and the silicon nitride oxide film were bonded to each other, and separation was performed along an embrittled layer. Thus, a single crystal silicon layer was formed over the glass substrate with the silicon nitride oxide film and the oxide film interposed therebetween. After that, the surface of the single crystal silicon layer obtained over the glass substrate was observed using a dust inspection machine (GI-4600, a glass substrate surface inspection device manufactured by Hitachi Electronics Engineering Co., Ltd.).

Formation of the oxide film was performed as in Example 1, conditions of hydrogen ion irradiation and plasma treatment of the oxide film were set as in Example 1, and formation of the silicon nitride oxide film was performed under the same conditions as those in Example 2.

Further, as a comparative example, an oxide film and a silicon nitride oxide film were bonded to each other without performing plasma treatment, and separation was performed along an embrittled layer, whereby a single crystal silicon layer was formed over a glass substrate with the silicon nitride oxide film and the oxide film interposed therebetween, and then, a surface of the single crystal silicon layer obtained over the glass substrate was observed in a similar manner to the foregoing.

Figure 16A:
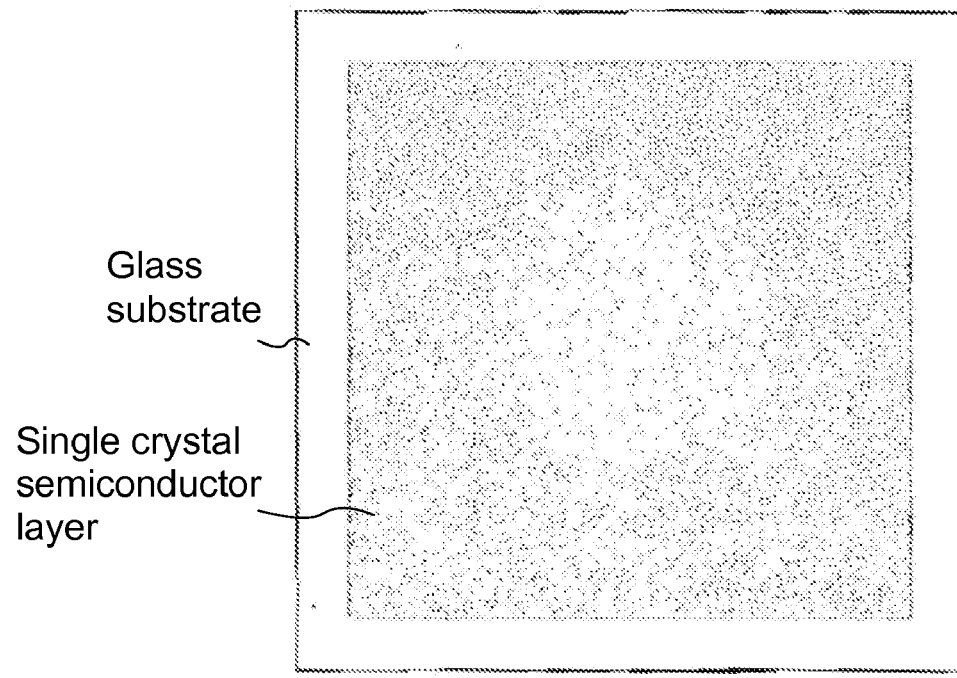
FIGS. 16A and 16B are diagrams each illustrating a surface of a single crystal silicon layer formed over a glass substrate.
Figure 16B:
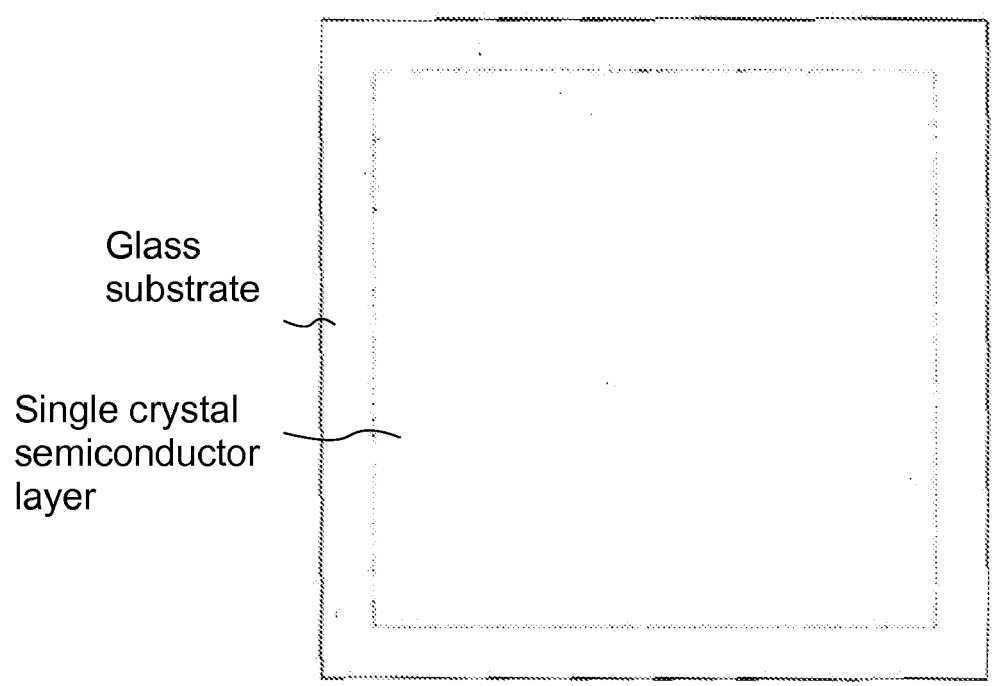

FIGS. 16A and 16B show a single crystal semiconductor layer which was not subjected to plasma treatment and a single crystal semiconductor layer which was subjected to plasma treatment, respectively.

In the case where bonding was performed without performing plasma treatment, a number of defects were observed in the obtained single crystal semiconductor layer (FIG. 16A). On the other hand, in the case where bonding was performed after performing plasma treatment, few defects were observed in the single crystal semiconductor layer formed over the glass substrate and it was confirmed that bonding between the oxide film and the silicon nitride oxide film was favorably performed (FIG. 16B).

Accordingly, it was confirmed that, even in the case where the nitrogen-containing layer was used as a bonding layer, by performing plasma treatment on a bonding surface, bonding strength between the nitrogen-containing layer and the oxide film was able to be improved and defects in the single crystal semiconductor layer obtained over the glass substrate was able to be reduced.

This application is based on Japanese Patent Application serial No. 2008-166447 filed with Japan Patent Office on Jun. 25, 2008, the entire contents of which are hereby incorporated by reference.

The invention claimed is:

1. A method for manufacturing an SOI substrate comprising:

forming an oxide film over a semiconductor substrate;

irradiating the semiconductor substrate with ions through the oxide film to form an embrittled region at a predetermined depth from a surface of the semiconductor substrate;

forming a nitrogen-containing layer over a base substrate;

performing a plasma treatment on at least one of the oxide film formed over the semiconductor substrate and the nitrogen-containing layer formed over the base substrate;

bonding a surface of the oxide film and a surface of the nitrogen-containing layer to each other; and separating the semiconductor substrate along the embrittled region to form a semiconductor layer over the base substrate with the oxide film and the nitrogen-containing layer interposed therebetween.

2. A method for manufacturing an SOI substrate comprising:

forming an oxide film over a semiconductor substrate;

irradiating the semiconductor substrate with ions through the oxide film to form an embrittled region at a predetermined depth from a surface of the semiconductor substrate;

performing a first plasma treatment on a base substrate;

forming a nitrogen-containing layer over the base substrate;

performing a second plasma treatment on at least one of the oxide film formed over the semiconductor substrate and the nitrogen-containing layer formed over the base substrate;

bonding a surface of the oxide film and a surface of the nitrogen-containing layer to each other; and separating the semiconductor substrate along the embrittled region to form a semiconductor layer over the base substrate with the oxide film and the nitrogen-containing layer interposed therebetween.

3. A method for manufacturing an SOI substrate comprising:

forming an oxide film over each of a plurality of semiconductor substrates;

irradiating the plurality of semiconductor substrates with ions through the oxide films to form an embrittled region at a predetermined depth from each surface of the plurality of semiconductor substrates;

forming a nitrogen-containing layer over a base substrate;

performing a plasma treatment on at least one of the oxide film formed over the each of the plurality of semiconductor substrates and the nitrogen-containing layer formed over the base substrate;

bonding a surface of the oxide film and a surface of the nitrogen-containing layer to each other; and separating the plurality of semiconductor substrates along the embrittled region to form a plurality of semiconductor layers over the base substrate with the oxide film and the nitrogen-containing layer interposed therebetween.

4. A method for manufacturing an SOI substrate comprising:

forming an oxide film over each of a plurality of semiconductor substrates;

irradiating the plurality of semiconductor substrates with ions through the oxide films to form an embrittled region at a predetermined depth from each surface of the plurality of semiconductor substrates;

performing a first plasma treatment on a base substrate;

forming a nitrogen-containing layer over the base substrate;

performing a second plasma treatment on at least one of the oxide film formed over the each of the plurality of semiconductor substrates and the nitrogen-containing layer formed over the base substrate;

bonding a surface of the oxide film and a surface of the nitrogen-containing layer to each other; and separating the plurality of semiconductor substrates along the embrittled region to form a plurality of semiconductor layers over the base substrate with the oxide film and the nitrogen-containing layer interposed therebetween.

5. The method for manufacturing an SOI substrate according to claim 1 or 3, wherein the plasma treatment is performed in a state in which a bias voltage is applied.

6. The method for manufacturing an SOI substrate according to claim 2 or 4, wherein the first plasma treatment and the second plasma treatment are performed in a state in which a bias voltage is applied.

7. The method for manufacturing an SOI substrate according to any one of claims 1 to 4, wherein the oxide film is formed by performing a thermal oxidation treatment on the semiconductor substrate in an oxidizing atmosphere containing hydrogen chloride or trans-1,2-dichloroethylene.

8. The method for manufacturing an SOI substrate according to any one of claims 1 to 4, wherein the base substrate is a glass substrate.

9. The method for manufacturing an SOI substrate according to any one of claims 1 to 4, wherein the irradiating step is performed by using an ion doping apparatus.

10. The method for manufacturing an SOI substrate according to any one of claims 1 to 4, wherein the ions contain $H_3^+$ ions.

11. The method for manufacturing an SOI substrate according to any one of claims 1 to 4, wherein the separating step is performed by a heat treatment at a temperature of lower than or equal to a strain point of the base substrate.

* * * * *